US012660191B2

(12) United States Patent
Kosako

(10) Patent No.: US 12,660,191 B2
(45) Date of Patent: Jun. 16, 2026

(54) SEMICONDUCTOR STORAGE DEVICE WITH REDUCED THRESHOLD VOLTAGE FLUCTUATIONS

(71) Applicant: Kioxia Corporation, Tokyo (JP)

(72) Inventor: Hiroaki Kosako, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 531 days.

(21) Appl. No.: 18/151,379

(22) Filed: Jan. 6, 2023

(65) Prior Publication Data

US 2023/0328994 A1 Oct. 12, 2023

(30) Foreign Application Priority Data

Apr. 7, 2022 (JP) ................................. 2022-063754

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30;

H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 9,672,918 B2 | 6/2017 | Hashimoto | |
| 10,770,117 B1 | 9/2020 | Takekida | |
| 10,784,275 B1 | 9/2020 | Maejima | |
| (Continued) | | | |

FOREIGN PATENT DOCUMENTS

| | | |
|---|---|---|
| CN | 105989881 A | 10/2016 |
| CN | 111627919 A | 9/2020 |
| (Continued) | | |

OTHER PUBLICATIONS

Chinese Office Action dated Mar. 26, 2026, mailed in counterpart Chinese Application No. 202211696276.9, 41 pages.

*Primary Examiner* — William B Partridge
*Assistant Examiner* — Gustavo G Ramallo
(74) *Attorney, Agent, or Firm* — Kim & Stewart LLP

(57) ABSTRACT

According to one embodiment, a semiconductor storage device includes word lines stacked in a first direction with bit lines above word lines in the first direction. A plurality of select gate lines are between the word lines and the bit lines in the first direction, and a semiconductor layer extends through the word lines and select gate lines. A charge storage film is between the word lines and the first semiconductor layer. The plurality of select gate lines includes a first select gate line closest to the word lines with a first thickness and second select gate line between the first select gate line and the bit lines with a second thickness. The first thickness is less than the second thickness.

20 Claims, 15 Drawing Sheets

(56)        References Cited

U.S. PATENT DOCUMENTS

| | | | | |
|---|---|---|---|---|
| 11,201,166 | B2 * | 12/2021 | Choi ..................... | H10B 43/27 |
| 11,251,193 | B2 | 2/2022 | Komiya | |
| 2010/0207194 | A1 * | 8/2010 | Tanaka ................... | H10B 43/27 |
| | | | | 438/588 |
| 2013/0092994 | A1 | 4/2013 | Shim | |
| 2013/0341703 | A1 * | 12/2013 | Shinohara .......... | H10D 30/0413 |
| | | | | 257/326 |
| 2017/0062054 | A1 | 3/2017 | Maeda | |
| 2017/0103999 | A1 | 4/2017 | Lee | |
| 2019/0088331 | A1 * | 3/2019 | Kobayashi ............. | G11C 16/08 |
| 2019/0333581 | A1 | 10/2019 | Diep | |
| 2019/0386019 | A1 * | 12/2019 | Yun ....................... | H10B 43/10 |
| 2020/0075625 | A1 | 3/2020 | Kobayashi | |
| 2023/0099107 | A1 * | 3/2023 | Zhang .................... | H10B 41/20 |
| | | | | 257/213 |
| 2023/0328994 | A1 * | 10/2023 | Kosako ................. | H10B 43/27 |
| | | | | 257/326 |

FOREIGN PATENT DOCUMENTS

| | | | |
|---|---|---|---|
| CN | 111696605 A | 9/2020 | |
| CN | 111725211 A | 9/2020 | |
| JP | 2017045492 A | 3/2017 | |
| TW | 202010093 A | 3/2020 | |

* cited by examiner

Figure 3:
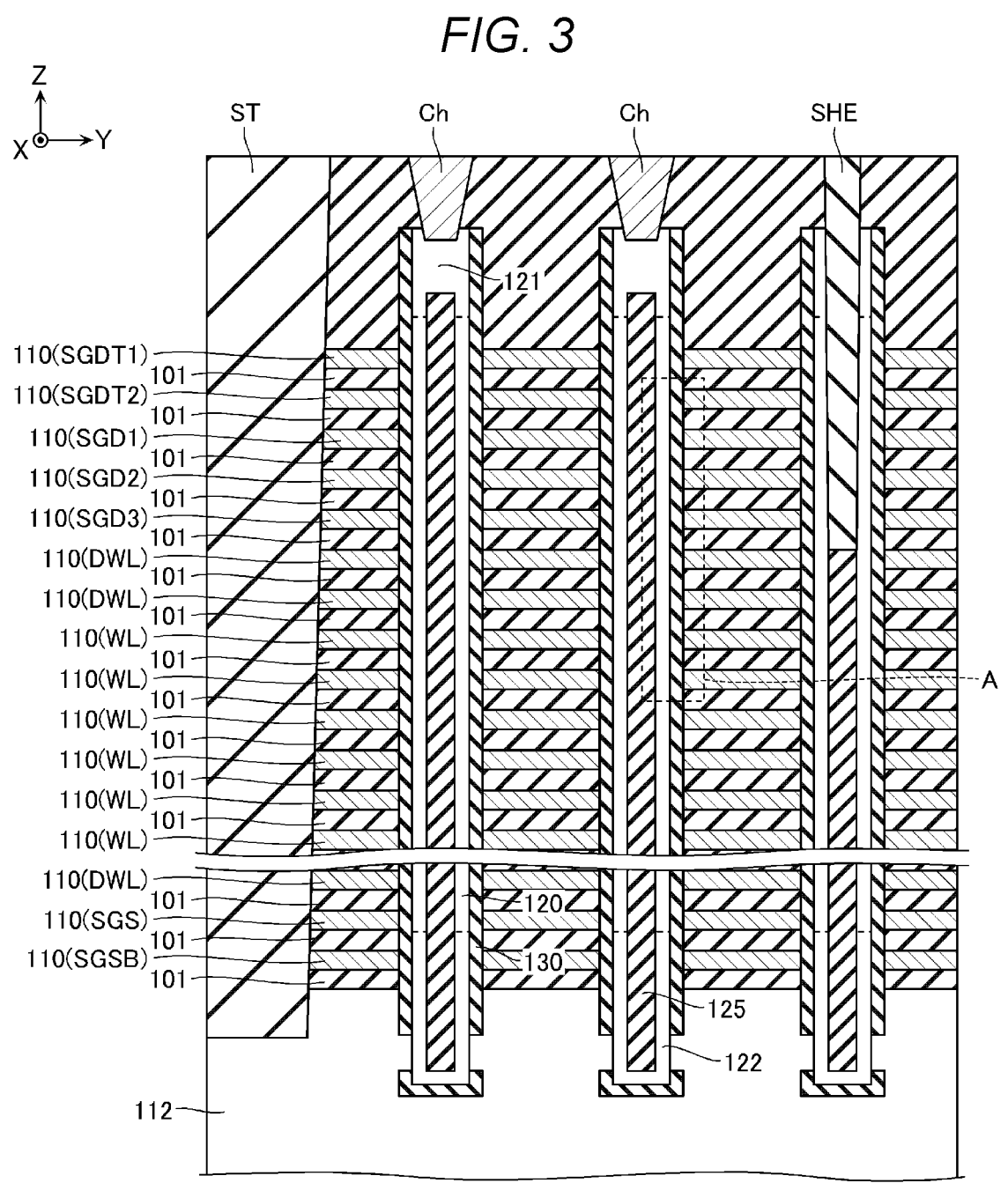

ST          Ch          Ch          SHE

110(SGDT1)
101
110(SGDT2)
101
110(SGD1)
101
110(SGD2)
101
110(SGD3)
101
110(DWL)
101
110(DWL)
101
110(WL)
101
110(WL)
101
110(WL)
101
110(WL)
101
110(WL)
101
110(WL)

110(DWL)
101
110(SGS)
101
110(SGSB)
101

112

121

A

120

130

125

122

SEMICONDUCTOR STORAGE DEVICE WITH REDUCED THRESHOLD VOLTAGE FLUCTUATIONS

CROSS-REFERENCE TO RELATED APPLICATION(S)

This application is based upon and claims the benefit of priority from Japanese Patent Application No. 2022-063754, filed Apr. 7, 2022, the entire contents of which are incorporated herein by reference.

FIELD

Embodiments described herein relate generally to a semiconductor storage device.

BACKGROUND

There is known a semiconductor storage device that includes a substrate, a plurality of conductive layers stacked on a surface of the substrate, and a semiconductor layer extending through the plurality of conductive layers with a charge storage film interposed between the conductive layers and the semiconductor layer.

BRIEF DESCRIPTION OF THE DRAWINGS

FIG. 3 is a schematic cross-sectional view showing a partial configuration of a memory cell array.

DETAILED DESCRIPTION

Figure 1:
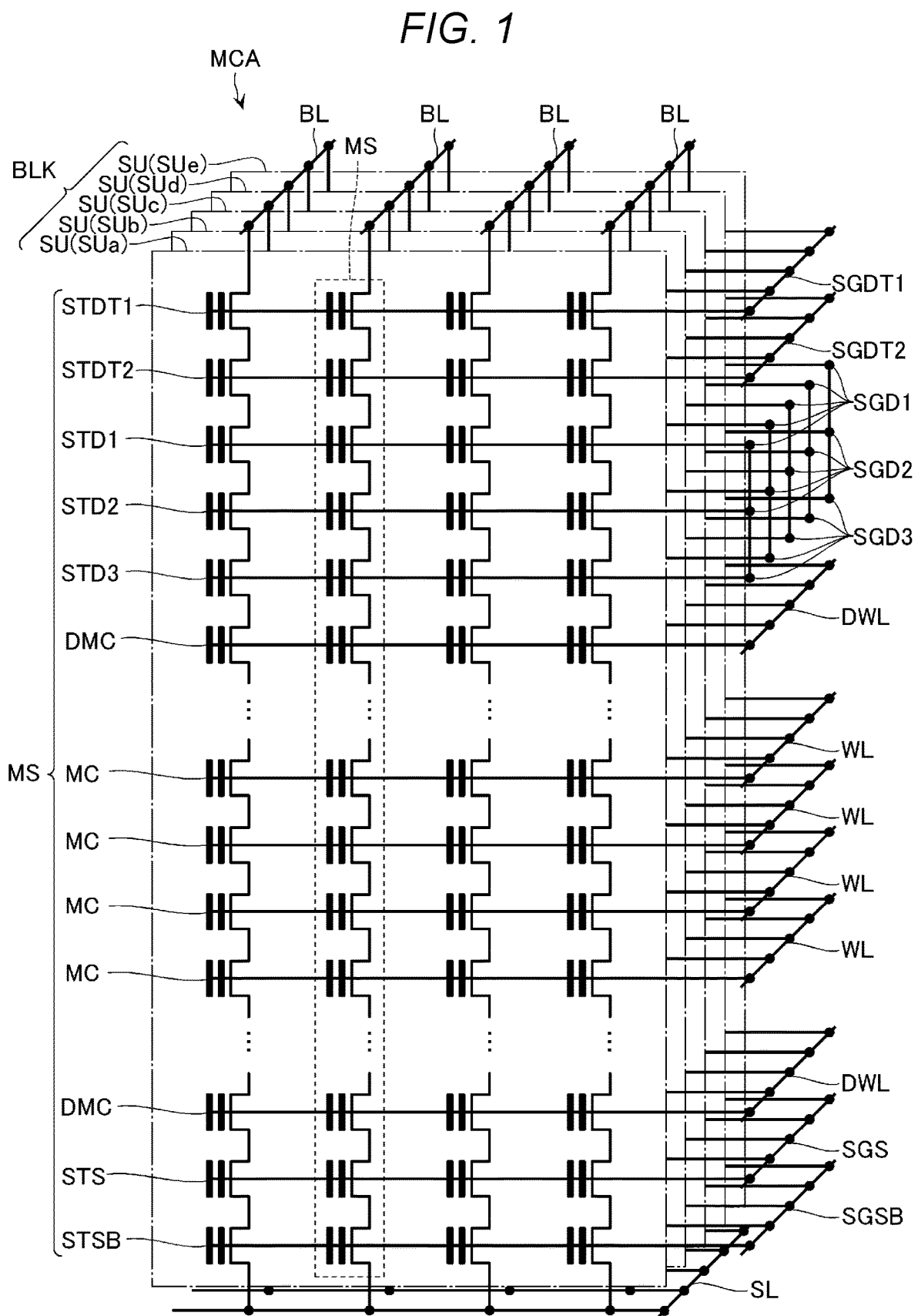
FIG. 1 is a schematic circuit diagram showing a partial configuration of a semiconductor storage device according to a first embodiment.

In general, according to one embodiment, a semiconductor storage device includes a plurality of word lines spaced from each other in a first direction, a plurality of bit lines on one side of the plurality of word lines in the first direction, and a first plurality of select gate lines between the plurality of word lines and the plurality of bit lines in the first direction. The first plurality of select gate lines is spaced from each other in the first direction. A first semiconductor layer extends in the first direction through the plurality of word lines and the first plurality of select gate lines and electrically is connected to one of the plurality of bit lines. A charge storage film is between the plurality of word lines and the first semiconductor layer. The first plurality of select gate lines includes a first select gate line closest to the plurality of word lines in the first direction and having a first thickness in the first direction, and a second select gate line between the first select gate line and the plurality of bit lines in the first direction and having a second thickness in the first direction. The first thickness is less than the second thickness.

Next, a semiconductor storage device according to certain example embodiment will be described with reference to the drawings. The example embodiments are non-limiting. Also, the drawings are schematic, and for convenience of description, some configurations, components, or aspects may be omitted. Moreover, the same reference symbol is attached to a part which is common to more than one example embodiments, and the description of such repeated aspects may be omitted for subsequent embodiments.

In this specification, the term "semiconductor storage device" may refer to, depending on context, a memory die or a memory system including a controller die such as a memory chip, a memory card, a solid state drive (SSD), or the like. Furthermore, the term may also encompass a configuration with a host computer, such as a smartphone, tablet terminal, or personal computer.

Furthermore, in this specification, when a first component is said to be "electrically connected" to a second component, the first component may be directly connected to the second component or the first component may be connected to the second component via wiring, semiconductor materials, transistors, or the like. For example, if three transistors are connected in series, the first transistor can be said to be "electrically connected" to the third transistor even though the second transistor is presently in an OFF state.

Also, in this specification, when a first component is said to be "connected between" a second component and a third component, this may mean that the first component, the second component, and the third component are connected in series or that the second component is connected to the third component via the first component.

Furthermore, in this specification, when a circuit, a circuit component, or the like is said to "connect" two wirings or the like, this may mean that the circuit or the like includes a transistor or other circuit element that is provided in the current path between the two wirings, and that this transistor or the like is presently in an ON (conductive) state.

In this specification, a one direction parallel to the surface of the substrate is called the X direction, a direction parallel to the surface of the substrate and perpendicular to the X direction is called the Y direction, and a direction orthogonal to the surface of the substrate is called the Z direction.

Also, in this specification, directional expressions such as "up" and "down" are based on relative positioning from the substrate. For example, the direction away from the substrate along the Z direction is called up or upward, and the direction going toward (getting closer to) the substrate along the Z direction is called down or downward. In addition, when a lower surface or the lower end of a certain component is referred to, "lower" means in this context the surface or the end portion of the component on the side closer to or facing the substrate. Similarly, when a upper surface or the upper end of a component is referred to, "upper" means in this context the surface or the end portion of the component farther from or facing away from the substrate. Also, a surface that intersects the X direction or the Y direction is called a side surface or the like.

First Embodiment

FIG. 1 is a schematic circuit diagram showing a partial configuration of a semiconductor storage device according to a first embodiment. The semiconductor storage device according to the first embodiment includes a memory cell array MCA and a peripheral circuit connected to the memory cell array MCA.

The memory cell array MCA comprises a plurality of memory blocks BLK. Each of the memory blocks BLK includes a plurality of string units SU. FIG. 1 shows an example in which one memory block BLK is provided with five string units SU (SUa to SUe). Each of the string units SU includes a plurality of memory strings MS. One end of each of the memory strings MS is connected to a peripheral circuit via a bit line BL. The opposite ends of the memory strings MS are connected to the peripheral circuit via a common source line SL.

Each memory string MS includes drain-side select transistors STDT1, STDT2, and STD1, STD2, STD3, a plurality of memory cells MC (memory transistors), one or more dummy memory cells DMC, and source-side select transistors STS and STSB. The drain-side select transistors STDT1, STDT2, and STD1 to STD3, the plurality of memory cells MC, the dummy memory cell(s) DMC, and the source-side select transistors STS and STSB are connected in series between a bit line BL and the source line SL. In the illustrated example, a dummy memory cell DMC is provided between the memory cells MC and the drain-side select transistor STD3 and between the memory cells MC and the source-side select transistor STS.

In the following description, the drain-side select transistors STDT1 and STDT2 may each be referred to as a drain-side select transistor STDT. Also, the drain-side select transistors STD1 to STD3 may be referred to as a drain-side select transistor STD. The drain-side select transistors STDT and STD and the source-side select transistors STS and STSB may be referred to collectively as select transistors (STDT, STD, STS, and STSB).

Each memory cell MC is a field effect transistor. A memory cell MC includes a semiconductor layer, a gate insulating film, and a gate electrode. The semiconductor layer functions as a channel region. The gate insulating film includes a charge storage film. The threshold voltage of the memory cell MC changes according to the amount of charge stored in the charge storage film. A memory cell MC stores 1-bit or multiple-bit data. A different word line WL is connected to each gate electrode of the plurality of memory cells MC corresponding to one memory string MS. These word lines WL are shared by all memory strings MS in the same memory block BLK.

A dummy memory cell DMC is basically configured in the same manner as the memory cells MC, but the dummy memory cell DMC is not used for data storage. The dummy memory cell DMC is used, for example, to reduce the difference between the voltage supplied to the memory cell MC and the voltage supplied to the select transistors (STD and STS). A different dummy word line DWL can be connected to the gate electrodes of dummy memory cells DMC in same memory string MS. These dummy word lines DWL can be shared by all memory strings MS in the same memory block BLK.

The drain-side select transistors STDT1 and STDT2 and the source-side select transistors STS and STSB are field effect transistors. The drain-side select transistors STDT1 and STDT2 and the source-side select transistors STS and STSB each include a semiconductor layer, a gate insulating film, and a gate electrode. The semiconductor layer functions as a channel region. The drain-side select gate lines SGDT1 and SGDT2 and the source-side select gate lines SGS and SGSB are respectively connected to the gate electrodes of the drain-side select transistors STDT1 and STDT2 and the source-side select transistors STS and STSB. The drain-side select gate lines SGDT1 and SGDT2 and the source-side select gate lines SGS and SGSB are connected to all memory strings MS in one memory block BLK.

The drain-side select transistors STD1 to STD3 are field effect transistors. The drain-side select transistors STD1 to STD3 each include a semiconductor layer, a gate insulating film, and a gate electrode. The semiconductor layer functions as a channel region. The drain-side select gate lines SGD1 to SGD3 are respectively connected to the drain-side select transistors STD1 to STD3. The drain-side select gate lines SGD1 to SGD3 are connected to all memory strings MS in the same string unit SU. Also, the drain-side select gate lines SGD1 to SGD3 are provided corresponding to each string unit SU. The drain-side select gate lines SGD1 to SGD3 corresponding to the string unit SUa are electrically connected to one another. Similarly, the drain-side select gate lines SGD1 to SGD3 corresponding to the string units SUb to SUe are electrically connected to one another.

The drain-side select gate lines SGDT1 and SGDT2 may be referred to as the drain-side a select gate line SGDT. Also, the drain-side select gate lines SGD1 to SGD3 may be referred to as a drain-side select gate line SGD. Also, the drain-side select gate lines SGDT and SGD and the source-side select gate lines SGS and SGSB may be collectively referred to as select gate lines (SGDT, SGD, SGS, and SGSB).

A bit line BL is connected to all string units SU in the memory cell array MCA. All memory strings MS provided in the same string unit SU are connected to different bit lines BL.

The source lines SL are connected to all memory strings MS in the memory cell array MCA.

A peripheral circuit for the semiconductor storage device includes, for example, a voltage generation circuit that generates an operating voltage, a voltage transfer circuit that transfers the generated operating voltage to the selected bit line(s) BL, word line(s) WL, dummy word line(s) DWL, source line SL, select gate lines (SGDT, SGD, SGS, and SGSB), and the like, a sense amplifier module connected to the bit lines BL; and a sequencer for controlling the application of voltages to the various lines.

Figure 2:
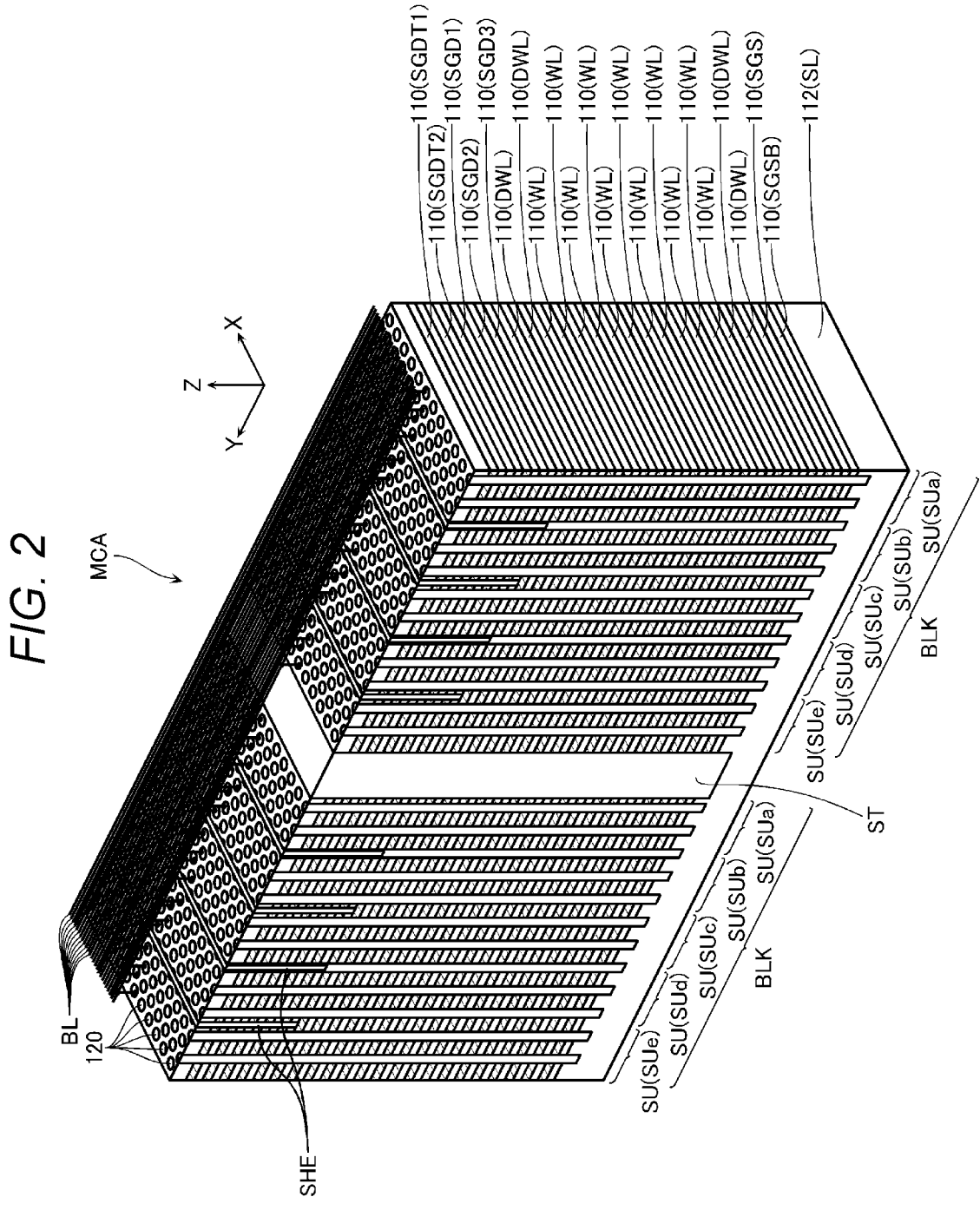
FIG. 2 is a schematic perspective view showing a partial configuration of a memory cell array.
Figure 4:
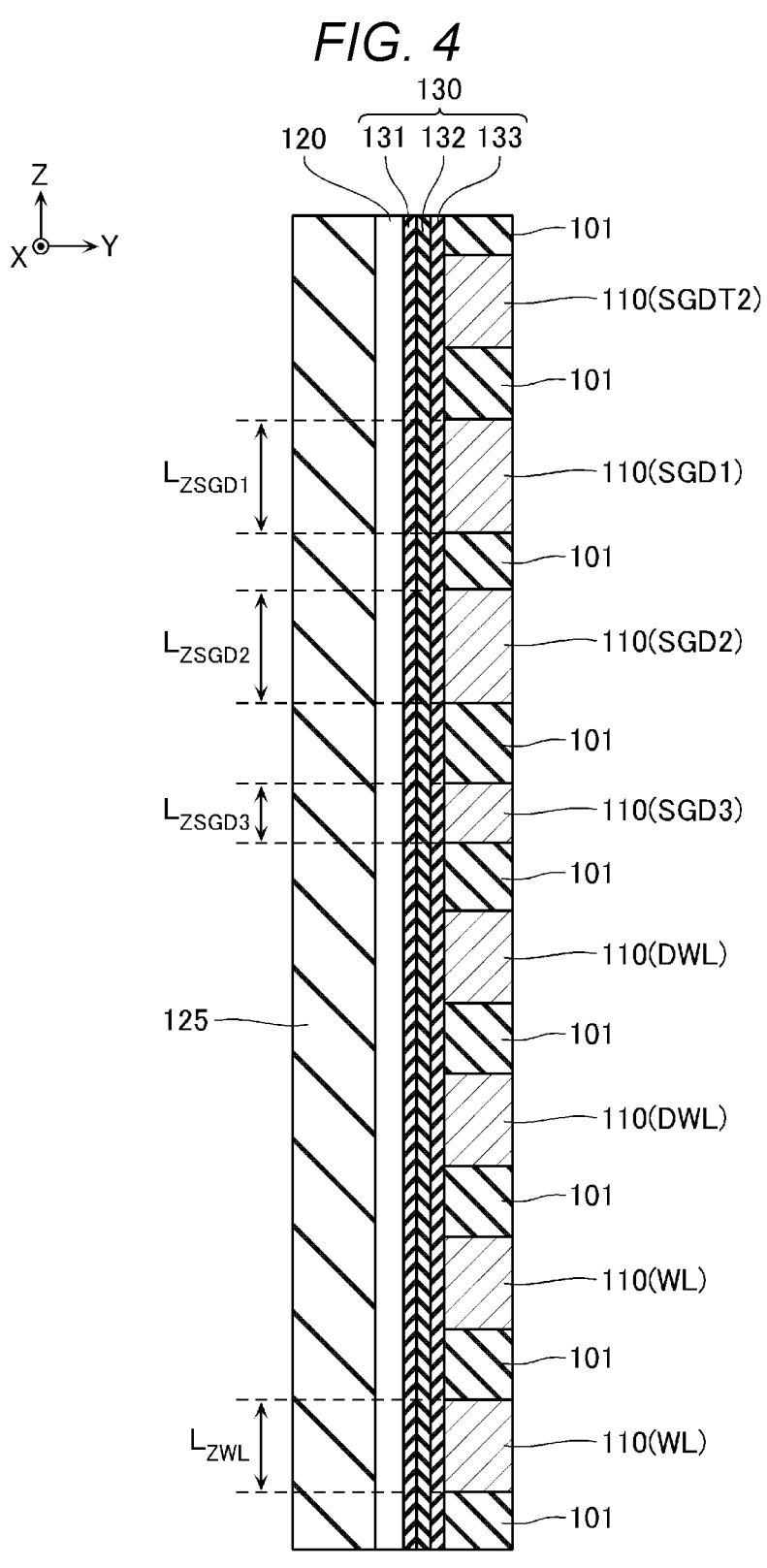
FIG. 4 depicts an enlarged view of the region indicated by the reference label A in FIG. 3.

FIG. 2 is a schematic perspective view showing a partial configuration of the memory cell array MCA. FIG. 3 is a schematic cross-sectional view showing a partial configuration of the memory cell array MCA. FIG. 4 is a schematic cross-sectional view showing an enlarged portion indicated by reference label A in FIG. 3. Although FIG. 4 shows a YZ cross-section, a structure similar to that depicted in FIG. 4 may be observed for a cross section other than the YZ cross-section taken along the central axis of a semiconductor layer 120 (for example, an XZ cross-section).

The memory cell array MCA is provided on a substrate. As shown in FIG. 2, the memory cell array MCA includes a plurality of memory blocks BLK located along the Y direction. An inter-memory-block insulating layer ST, such as silicon oxide (SiO2), is provided between two memory blocks BLK adjacent to each other in the Y direction.

Each memory block BLK includes a plurality of string units SU (SUa to SUe) spaced in the Y direction. An inter-string-unit insulating layer SHE, such as silicon oxide (SiO2) or the like, is provided between two string units SU adjacent to each other in the Y direction.

For example, as shown in FIG. 2, a memory block BLK includes a plurality of conductive layers 110 stacked in the Z direction, a conductive layer 112 provided below the plurality of conductive layers 110, and a plurality of semiconductor layers 120 (columns) extending in the Z direction. As shown in FIG. 3, gate insulating films 130 are provided between the plurality of conductive layers 110 and the semiconductor layers 120.

Each conductive layer 110 has a substantially plate-like shape extending in the X and Y directions. A conductive layer 110 may comprise a stacked film of a barrier conductive film such as titanium nitride (TiN) and a metal film such as tungsten (W). Also, the conductive layer 110 may contain or comprise polycrystalline silicon containing impurities (dopants) such as phosphorus (P) or boron (B). An insulating layer 101 (FIG. 3) such as silicon oxide (SiO2) is provided between the stacked conductive layers 110 in the Z direction.

The plurality of conductive layers 110 function as gate electrodes and the word lines WL (FIG. 1) for the plurality of memory cells MC (FIG. 1) connected thereto. In the following description, a conductive layer 110 functioning as a word line WL may be called a conductive layer 110(WL). The conductive layers 110(WL) are electrically independent for each memory block BLK. In the example of FIG. 2, conductive layers 110(WL) corresponding to two memory blocks BLK adjacent to each other in the Y direction are insulated (electrically separated from one another) via an inter-memory-block insulating layer ST.

One or more conductive layers 110 positioned above the plurality of conductive layers 110(WL) and one or more conductive layers 110 positioned below the plurality of conductive layers 110(WL) function as dummy word lines DWL (FIG. 1) for the dummy memory cells DMC (FIG. 1) connected thereto. In the following description, a conductive layer 110 functioning as a dummy word line DWL may be called a conductive layer 110(DWL). The conductive layers 110(DWL) can be configured similarly to the conductive layer 110(WL).

One or more conductive layers 110 located below the plurality of conductive layers 110(WL) and 110(DWL) function as the source-side select gate line SGS (FIG. 1) for the source-side select transistors STS (FIG. 1) connected thereto. In the following description, a conductive layer 110 functioning as source-side select gate line SGS may be called a conductive layer 110(SGS). The conductive layers 110(SGS) can be configured similarly to the conductive layer 110(WL).

One or more conductive layers 110 positioned below the conductive layer(s) 110(SGS) function as the source-side select gate line SGSB (FIG. 1) for the source-side select transistors STSB (FIG. 1) connected thereto. In the following description, a conductive layer 110 functioning as a source-side select gate line SGSB may be called a conductive layer 110(SGSB). The conductive layers 110(SGSB) are configured similarly to the conductive layer 110(WL).

The conductive layers 110 positioned above the plurality of conductive layers 110(WL) and 110(DWL) function as the drain-side select gate lines SGD1 to SGD3 (FIG. 1) for the plurality of drain-side select transistors STD1 to STD3 (FIG. 1) connected thereto. In the following description, a conductive layer 110 functioning as a drain-side select gate lines SGD1 to SGD3 may be called a conductive layer 110(SGD) or a conductive layer 110(SGD1), 110(SGD2), or 110(SGD3). As shown in FIG. 2, the Y-direction width of the plurality of conductive layers 110(SGD) is smaller than the Y-direction width of the conductive layers 110(WL). An inter-string-unit insulating layer SHE is provided between conductive layers 110(SGD) adjacent to each other in the Y direction in a memory block BLK.

The conductive layers 110(SGD) are electrically independent for each string unit SU. In each memory block BLK, conductive layers 110(SGD) adjacent to each other in the Y direction are electrically insulated via the inter-string-unit insulating layer SHE. In each memory block BLK, conductive layers 110(SGD) corresponding to the first and fifth string units SUa and SUe counted from one side in the Y direction (for example, the negative side in the Y direction) are electrically insulated from the other memory blocks BLK via the inter-memory-block insulating layer ST provided between adjacent memory blocks BLK.

The conductive layers 110 positioned above the conductive layers 110(SGD) function as the drain-side select gate lines SGDT1 and SGDT2 (FIG. 1) for the drain-side select transistors STDT1 and STDT2 (FIG. 1) connected thereto. In the following description, a conductive layer 110 functioning as a drain-side select gate line SGDT1 or SGDT2 may be called a conductive layer 110(SGDT) or a conductive layer 110(SGDT1) or 110(SGDT2). The conductive layers 110(SGDT) can ne basically configured similarly to the conductive layer 110(SGD). The conductive layers 110(SGDT) provided in one memory block BLK can be electrically connected to each other via wiring or the like.

The conductive layer 112 may comprise, for example, polycrystalline silicon containing N-type impurities such as phosphorus (P). In other examples, a conductive material such as a metal such as tungsten (W), tungsten silicide, or another type conductive material may be provided on the lower surface of the conductive layer 112. The conductive layer 112 functions as the source line SL (FIG. 1).

The semiconductor layers 120 are located in a predetermined pattern arrayed in the X direction and the Y direction. In the present example, each semiconductor layer 120 functions as a channel region of memory cells MC, dummy memory cells DMC, and select transistors (STDT, STD, STS, and STSB) in a single memory string MS (FIG. 1). The semiconductor layer 120 has a substantially cylindrical shape (columnar or pillar shape), and an insulating layer 125 (FIG. 3) such as silicon oxide or the like is provided in the central (core) portion. In addition, the outer peripheral surfaces of the semiconductor layers 120 are surrounded by conductive layers 110 and face the conductive layers 110.

The semiconductor layer 120 comprises, for example, polycrystalline silicon (Si) or the like. The region of the semiconductor layer 120 facing the conductive layers 110 (WL), 110(DWL), and 110(SGS) may be undoped. The region of the semiconductor layer 120 facing the conductive layer 110(SGD) may be undoped or may contain P-type impurities such as boron (B). The region of the semiconductor layer 120 facing the conductive layer 110(SGDT) may be undoped or may contain N-type impurities such as phosphorus (P). The region of the semiconductor layer 120 facing the conductive layer 110(SGSB) may contain N-type impurities such as phosphorus (P).

As depicted in FIG. 3, the upper end portion of each semiconductor layer 120 is provided with an impurity region 121 containing N-type impurities such as phosphorus (P). The impurity region 121 is connected to the bit line BL through via contact electrodes Ch and Vy (see FIG. 5). All the semiconductor layers 120 within one string unit SU are connected to different bit lines BL. In the example of FIG. 2, four rows including a plurality of semiconductor layers 120 located in the X direction are located in the Y direction corresponding to one string unit SU. All the plurality of semiconductor layers 120 provided in these four rows are connected to different bit lines BL.

As shown in FIG. 3, an impurity region 122 containing N-type impurities such as phosphorus (P) is provided at the lower end portion of the semiconductor layers 120. This impurity region 122 is connected to the conductive layer 112. All the semiconductor layers 120 in the memory cell array MCA can be connected to the same conductive layer 112 (which may be referred as a common conductive layer 112).

The gate insulating film 130 has a substantially cylindrical shape and covers the outer peripheral surface of the semiconductor layer 120. The gate insulating film 130 includes a tunnel insulating film 131, a charge storage film 132, and a block insulating film 133, which are layered between the semiconductor layer 120 and the conductive layer 110, for example, as shown in FIG. 4. The tunnel insulating film 131 and the block insulating film 133 comprise, for example, silicon oxide (SiO2) or the like. The charge storage film 132 may be any film material capable of storing charges, such as silicon nitride (SiN) or the like. The tunnel insulating film 131, the charge storage film 132, and the block insulating film 133 have a substantially cylindrical shape and for example, as shown in FIG. 3, extend in the Z direction along the outer peripheral surface of the semiconductor layer 120 excluding the contacting portion between the semiconductor layer 120 and the conductive layer 112.

FIG. 4 shows an example in which the gate insulating film 130 includes the charge storage film 132 such as silicon nitride. However, the gate insulating film 130 may be a floating gate type comprising materials such as polycrystalline silicon containing N-type or P-type impurities.

Z-Direction Lengths of Drain-Side Select Gate Lines SGD1 to SGD3

In FIG. 4, the Z-direction lengths (thicknesses) of the conductive layers 110(SGD1) to 110(SGD3) are indicated as lengths LZSGD1 to LZSGD3, respectively. In the illustrated example, the lengths LZSGD1 and LZSGD2 of the conductive layers 110(SGD1) and 110(SGD2) are greater than the length LZSGD3 of the conductive layer 110(SGD3). The lengths LZSGD1 and LZSGD2 are approximately the same. That is, the layer thicknesses of the conductive layers 110(SGD1) and 110(SGD2) are greater than the layer thickness of the conductive layer 110(SGD3), and the layer thicknesses of the conductive layers 110(SGD1) and 110(SGD2) are approximately the same.

FIG. 4 shows the Z-direction length (thickness) of the conductive layers 110(WL) as the length LZWL. In the first embodiment, the lengths LZWL of the plurality of conductive layers 110(WL) are all approximately the same. Also, in this example, the Z-direction lengths of the conductive layers 110(DWL), 110(SGDT), 110(SGS), and 110(SGSB) are all approximately the same as the length LZWL of the conductive layer 110(WL).

In the example of FIG. 4, the lengths LZSGD1 and LZSGD2 of the conductive layers 110(SGD1) and 110(SGD2) are greater than the length LZWL of the conductive layer 110(WL). In addition, the length LZSGD3 of the conductive layer 110(SGD3) is less than the length LZWL of the conductive layer 110(WL).

Read Operation

Figure 5:
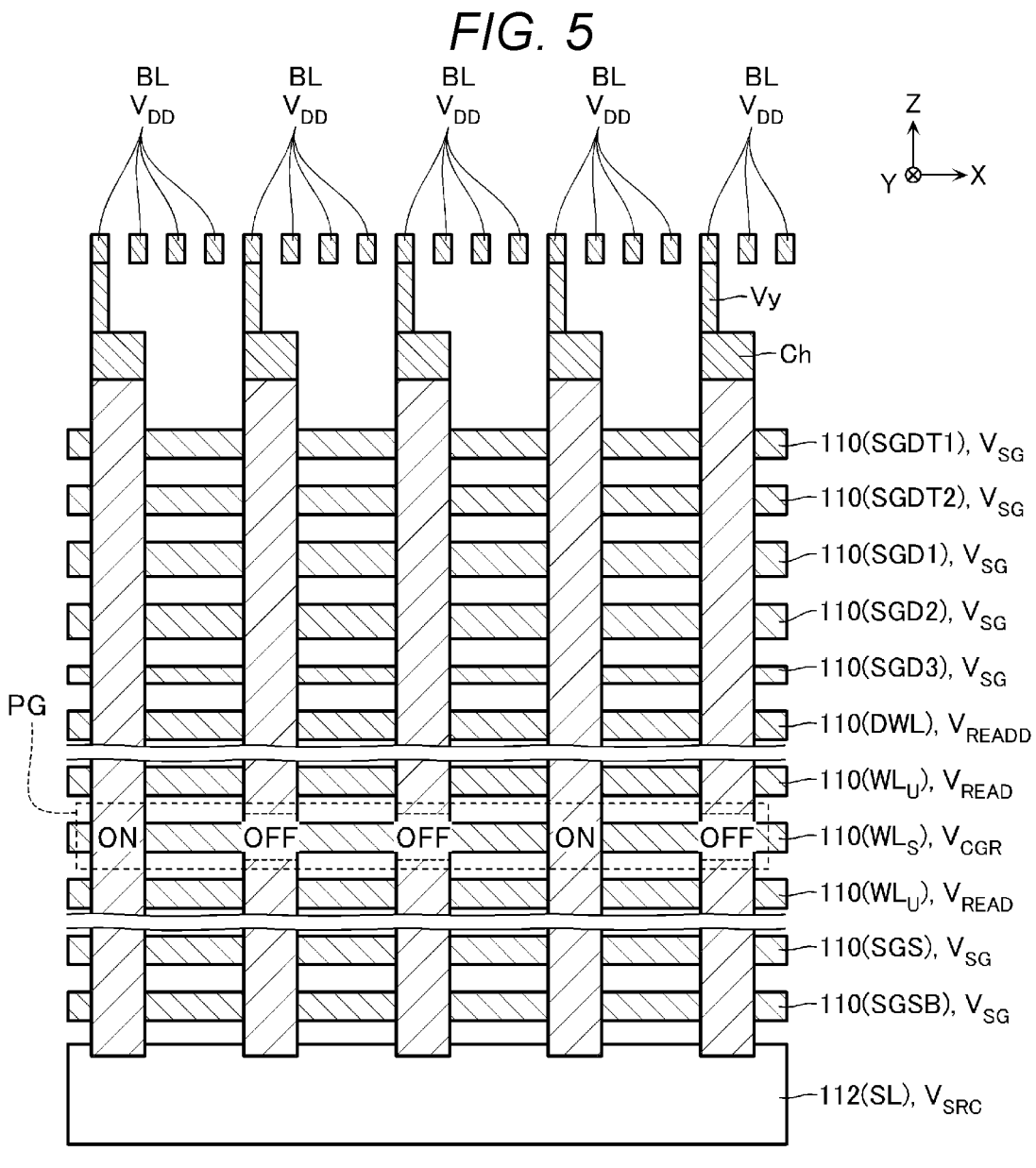
FIG. 5 is a schematic cross-sectional view related to explanation of a read operation.

FIG. 5 is a schematic cross-sectional view for illustrating a read operation.

In the following description, the particular word line WL to be read may be called a selected word line WLS, and the other word lines WL may be called unselected word lines WLU. In the following, among the plurality of memory cells MC provided in the same string unit SU to be read, those connected to the selected word line WLS are referred to as "selected memory cells MC" and those connected to unselected word lines WLU may be referred to as "unselected memory cells MC". A plurality of selected memory cells MC connected to the same selected word line WL may be referred to as a page portion PG.

An example of executing a read operation on the page portion PG in the string unit SUa will be described below.

In this read operation, a voltage VDD is supplied to the bit lines BL. A voltage VSRC different from the voltage VDD is supplied to the source line SL. The voltage VSRC may be greater than a ground voltage VSS or may be equal to the ground voltage VSS. The voltage VDD is greater than the voltage VSRC.

Also, in the read operation, a voltage VSG is supplied to the drain-side select gate line SGDT. The voltage VSG is greater than the voltage VDD. Also, the voltage difference between the voltage VSG and the voltage VDD is greater than the threshold voltage of the drain-side select transistor STDT. Therefore, an electron channel is formed in the channel region of the drain-side select transistor STDT, and the voltage VDD is transferred.

Also, in the read operation, the voltage VSG is supplied to the drain-side select gate line SGD for the string unit SUa. The voltage difference between the voltage VSG and the voltage VDD is greater than the threshold voltage of the drain-side select transistor STD. Therefore, an electron channel is formed in the channel region of the drain-side select transistor STD of the string unit SUa, and the voltage VDD is transferred.

Although not separately shown, in the read operation, the ground voltage VSS is supplied to the drain-side select gate lines SGD for the string units SUb to SUe. The voltage difference between the ground voltage VSS and the voltage VDD is less than the threshold voltage of the drain-side select transistor STD. Therefore, no electron channel is formed in the channel region of the drain-side select transistors STD of the string units SUb to SUe, and the voltage VDD is not transferred.

In the read operation, the voltage VSG is supplied to the source-side select gate lines SGS and SGSB. The voltage VSG is greater than the voltage VSRC. Also, the voltage difference between the voltage VSG and the voltage VSRC is greater than the threshold voltages of the source-side select transistors STS and STSB. Therefore, electron channels are formed in the channel regions of the source-side select transistors STS and STSB, and the voltage VSRC is transferred.

A voltage VREADD is supplied to the dummy word line DWL in the read operation. The voltage VREADD is, for example, greater than the voltage VSG supplied to the selected gate lines (SGD and SGS) and less than a read pass voltage VREAD supplied to the unselected word lines WLU. This reduces the sharp change in potential that would otherwise occur in the region between the select transistors (STD and STS) and the memory cell MC closest thereto. The voltage VREADD is greater than the voltages VDD and VSRC. Also, the voltage difference between the voltage VREADD and the voltages VDD and VSRC is greater than the threshold voltage of the dummy memory cell DMC. Therefore, an electron channel is formed in the channel region of the dummy memory cell DMC, and the voltages VDD and VSRC are transferred.

Also, in the read operation, the read pass voltage VREAD is supplied to the unselected word lines WLU. The read pass voltage VREAD is greater than the voltages VDD and VSRC. The voltage difference between the read pass voltage VREAD and the voltages VDD and VSRC is greater than the threshold voltage of the memory cell MC regardless of the data stored in the memory cell MC. Therefore, electron channels are formed in the channel regions of the unselected memory cells MC, and the voltages VDD and VSRC are transferred to the selected memory cells MC.

In the read operation, a read voltage VCGR is supplied to the selected word line WLS. The voltage difference between the read voltage VCGR and the voltage VSRC is greater than the threshold voltage of memory cells MC in which some data is presently stored. Therefore, the memory cells MC in which some data is stored are turned on, and current flows through the bit lines BL connected to such memory cells MC. The voltage difference between the read voltage VCGR and the voltage VSRC is less than the threshold voltage of memory cells MC in which some other data are stored. Therefore, the memory cells MC in which some other data are turned off, and no current flows through the bit lines BL connected to such memory cells MC.

In the read operation, a voltage generation circuit and a voltage transfer circuit in the peripheral circuit supply a voltage to wirings in the memory block BLK, and a sense amplifier module in the peripheral circuit detects the state of each bit line, for example, whether a current flows through the bit line BL. This detects the ON state and OFF state of the selected memory cell MC connected to the selected word line WLS which is supplied with the read voltage VCGR.

In addition, in the read operation, arithmetic processing such as AND, OR, or the like can be performed on the data for indicating the state of the selected memory cell MC obtained for each of the plurality of read voltages VCGR as necessary. Thereby, the data stored in the selected memory cell MC can be calculated.

Write Operation

Figure 6:
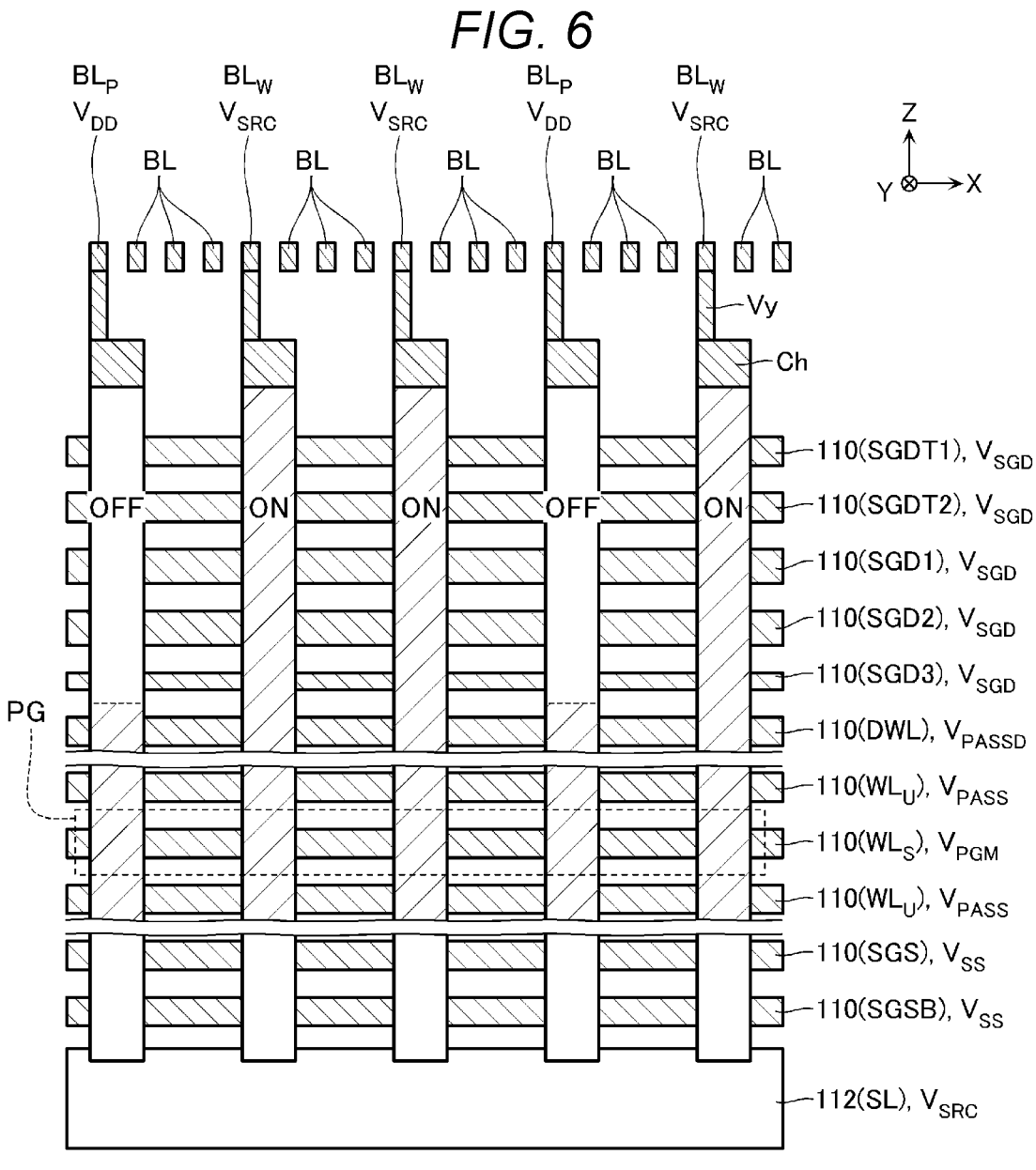
FIG. 6 is a schematic cross-sectional view related to explanation of a write operation.

FIG. 6 is a schematic cross-sectional view for illustrating a write operation.

In this write operation, the voltage VSRC is supplied to one or more bit lines BL (referred to as "bit line BLW") connected to those memory cells MC whose threshold voltage is to be adjusted (changed or written) from among the plurality of memory cells MC (selected memory cells MC). The voltage VDD is supplied to one or more bit lines BL (to as "bit line BLP") connected to those memory cells MC whose threshold voltage is not being adjusted. In the following description, memory cells MC whose threshold voltage is being adjusted in the write operation are referred to as "write memory cells MC" and all others are referred to as "inhibited memory cells MC".

In the write operation, a voltage VSGD is supplied to the drain-side select gate line SGDT and the drain-side select gate line SGD corresponding to the string unit SUa.

The voltage VSGD is greater than the voltage VSRC. Also, the voltage difference between the voltage VSGD and the voltage VSRC is greater than the threshold voltages of the drain-side select transistors STDT and STD. Therefore, electron channels are formed in the channel regions of the drain-side select transistors STDT and STD corresponding to the bit line BLW, and the voltage VSRC is transferred.

The voltage difference between the voltage VSGD and the voltage VDD is less than the threshold voltages of the drain-side select transistors STDT and STD. Therefore, the drain-side select transistors STDT and STD corresponding to the bit line BLP are turned off.

In the write operation, the ground voltage VSS is supplied to the drain-side select gate lines SGD corresponding to the string units SUb to SUe. The voltage difference between the ground voltage VSS and the voltages VSRC and VDD is less than the threshold voltage of the drain-side select transistor STD. Therefore, electron channels are not formed in the channel regions of the drain-side select transistors STD corresponding to the string units SUb to SUe, and the voltages VSRC and VDD are not transferred.

In the write operation, the voltage VSRC is supplied to the source line SL, and the ground voltage VSS is supplied to the source-side select gate lines SGS and SGSB. As a result, the source-side select transistors STS and STSB are turned off.

Also, a voltage VPASSD is supplied to the dummy word line DWL. The voltage VPASSD is, for example, greater than the voltage VSGD supplied to the drain-side select gate line SGD but less than a write pass voltage VPASS supplied to the unselected word lines WLU. This reduces the sharp change in potential in that would otherwise occur in the region between the drain-side select gate line SGD and the memory cell MC closest thereto. The voltage VPASSD is greater than the voltage VSRC. Also, the voltage difference between the voltage VPASSD and the voltage VSRC is greater than the threshold voltage of the dummy memory cell DMC. Therefore, an electron channel is formed in the channel region of the dummy memory cell DMC corresponding to the bit line BLW among the dummy memory cells DMC corresponding to the string unit SUa, and the voltage VSRC is transferred.

Also, in the write operation, the write pass voltage VPASS is supplied to the unselected word lines WLU. The write pass voltage VPASS is greater than the read pass voltage VREAD. In addition, the voltage difference between the write pass voltage VPASS and the voltage VSRC is greater than the threshold voltage of the memory cell MC regardless of the data stored in the memory cell MC. Therefore, among the unselected memory cells MC in the string unit SUa, an electron channel is formed in the channel region of those connected to the bit line BLW, and the voltage VSRC is transferred to the write memory cell MC.

A program voltage VPGM is supplied to the selected word line WLS in the write operation. The program voltage VPGM is greater than the write pass voltage VPASS.

Here, the voltage VSRC is supplied to the channel of the semiconductor layer 120 corresponding to the bit line BLW. A relatively large electric field is generated between the semiconductor layer 120 and the selected word line WLS. As a result, electrons in the channel of the semiconductor layer 120 may tunnel into the charge storage film 132 (FIG. 4) through the tunnel insulating film 131 (FIG. 4). Therefore, the threshold voltage of the write memory cell MC increases.

The channel of the semiconductor layer 120 corresponding to the bit line BLP and the channel of the semiconductor layer 120 corresponding to the string units SUb to SUe are in an electrically floating state, and the potential of these channels increases to about the write pass voltage VPASS due to capacitive coupling with the unselected word lines WLU. Between such a semiconductor layer 120 and the selected word line WLS, an electric field smaller than the electric field described above is generated. As a result, electrons in the channel of the semiconductor layer 120 do not tunnel into the charge storage film 132 (FIG. 4). Therefore, the threshold voltages of the inhibited memory cells MC and the like do not increase.

Erase Operation

Figure 7:
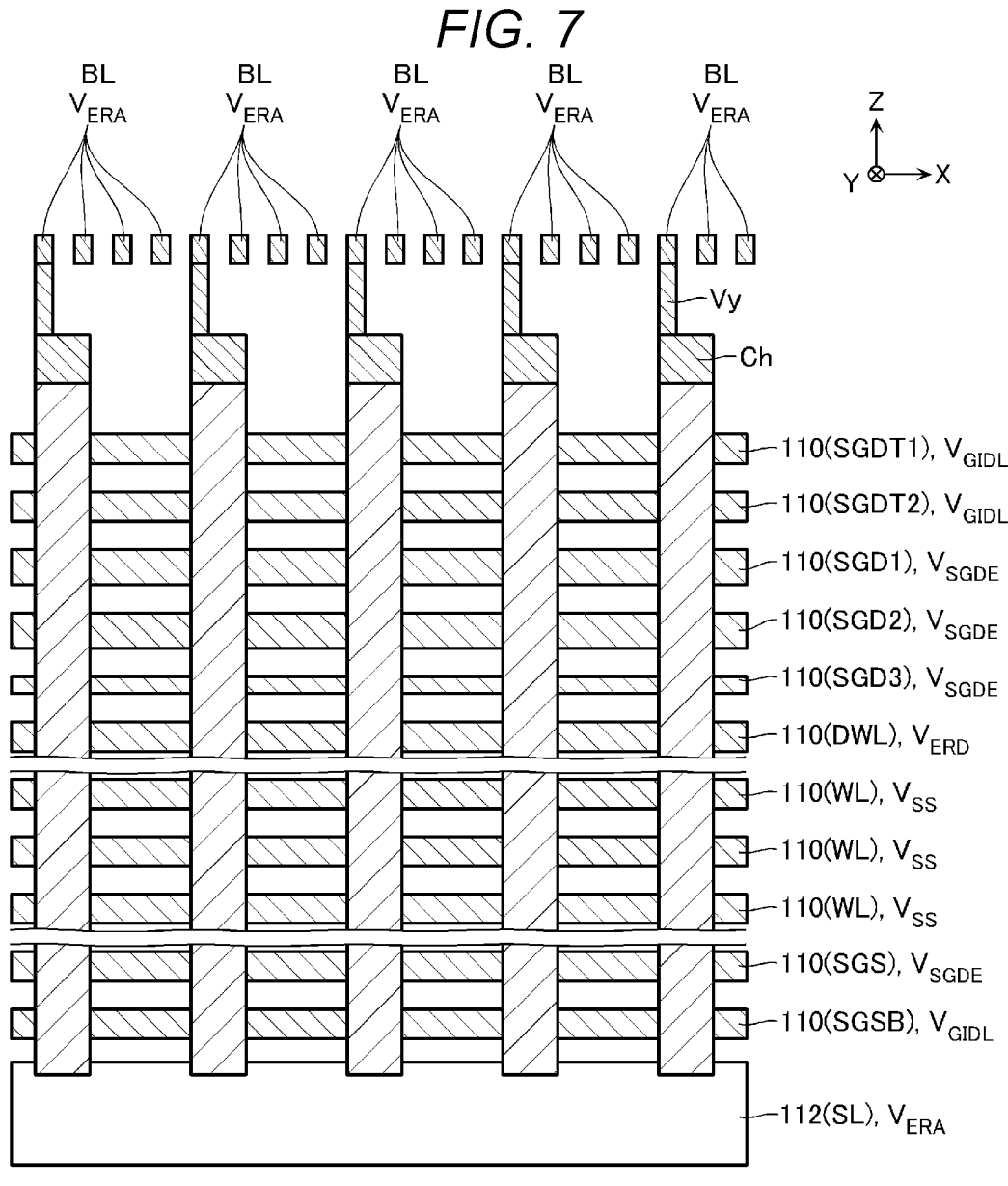
FIG. 7 is a schematic cross-sectional view related to explanation of an erase operation.

FIG. 7 is a schematic cross-sectional view for illustrating an erase operation.

In this erase operation, an erase voltage VERA is supplied to the bit lines BL and the source line SL. The erase voltage VERA may be, for example, greater than the program voltage VPGM or equal to the program voltage VPGM.

Also, in the erase operation, a voltage VGIDL is supplied to the drain-side select gate line SGDT and the source-side select gate line SGSB. The voltage VGIDL is less than the erase voltage VERA. As a result, gate induced drain leakage (GIDL) is generated in the drain-side select transistor STDT and the source-side select transistor STSB, and electron-hole pairs are generated. Electrons generated in the drain-side select transistor STDT move toward the bit line BL, and holes move toward the memory cell MC. Electrons generated in the source-side select transistor STSB move toward the source line SL, and holes move toward the memory cell MC.

A voltage VSGDE is supplied to the drain-side select gate line SGD and the source-side select gate line SGS in the erase operation. The voltage VSGDE is less than the erase voltage VERA. As a result, hole channels are formed in channel regions of the drain-side select transistor STD and the source-side select transistor STS.

Also, a voltage VERD is supplied to the dummy word line DWL. The voltage VERD is less than the voltage VSGDE supplied to the select gate lines (SGD and SGS) but greater than the ground voltage VSS supplied to the word lines WL. This reduces the sharp change in potential that would otherwise occur in the region between the select transistors (STD and STS) and the memory cell MC closest thereto. The voltage VERD is less than the erase voltage VERA. As a result, a hole channel is formed in the channel region of the dummy memory cell DMC.

In the erase operation, the ground voltage VSS is supplied to the word lines WL. As a result, holes in the channel of the semiconductor layer 120 tunnel into the charge storage film 132 (FIG. 4) through the tunnel insulating film 131 (FIG. 4). Therefore, the threshold voltage of the memory cell MC is reduced.

Drain-Side Select Transistor Write Operation

As was described with reference to FIG. 6, in a write operation, the bit line BLW is supplied with the voltage VSRC and the bit line BLP is supplied with the voltage VDD. Also, the voltage VSGD is supplied to the drain-side select gate line SGD, the drain-side select transistor STD connected to the bit line BLW is turned on, and the drain-side select transistor STD connected to the bit line BLP is turned off.

In order to implement such a writing method, the drain-side select transistor STD is desired to be controlled such that the variation in the threshold voltage is at least in the range of the difference between the voltages VDD and VSRC. Therefore, in the present embodiment, the amount of charge in the charge storage film 132 (FIG. 4) of the drain-side select transistor STD can be adjusted to adjust the threshold voltage of the drain-side select transistor STD.

Hereinafter, this type of writing operation will be referred to as a drain-side select transistor write operation.

Figure 8:
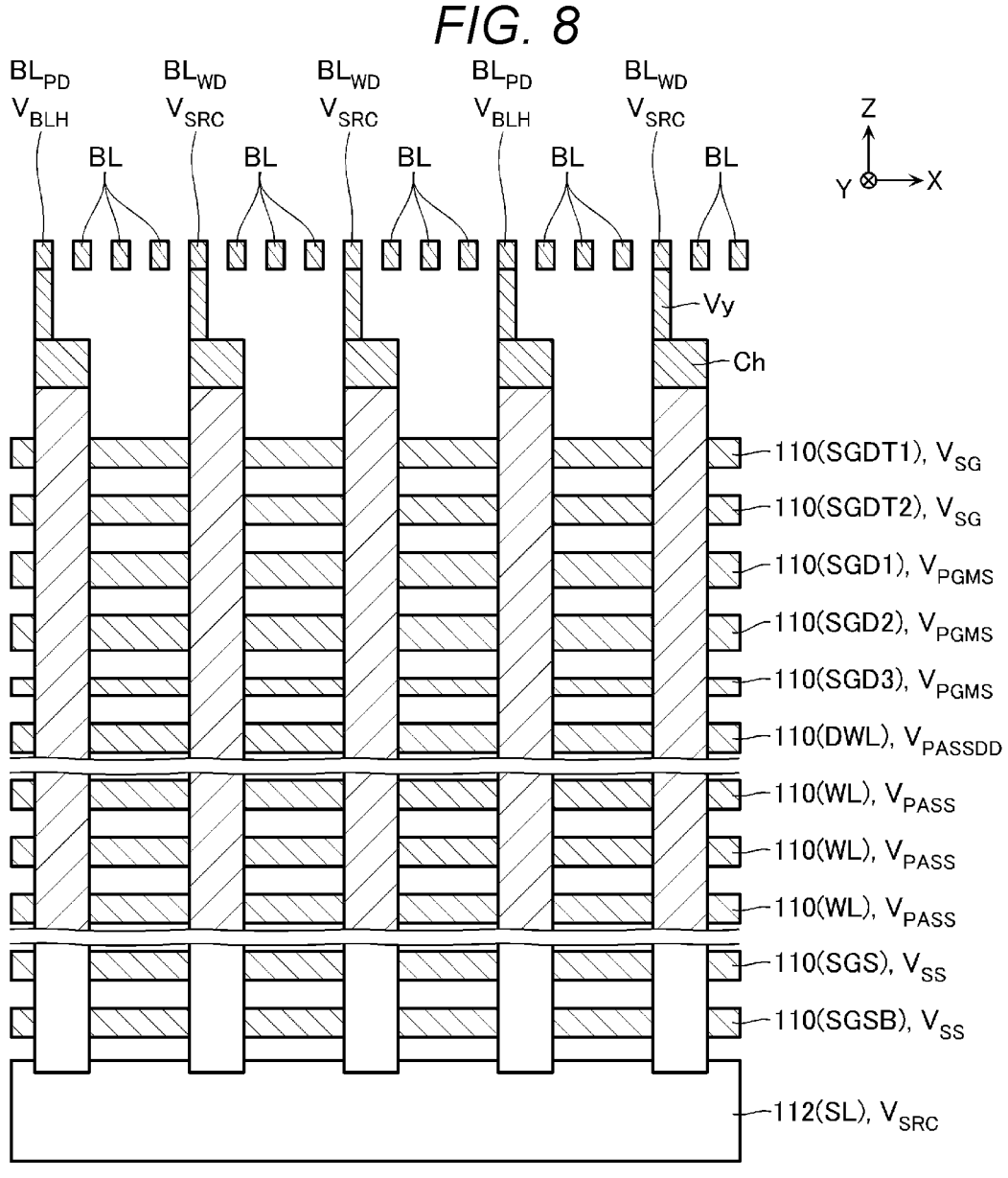
FIG. 8 is a schematic cross-sectional view related to explanation of a drain-side select transistor write operation.

FIG. 8 is a schematic cross-sectional view for illustrating a drain-side select transistor write operation.

In this drain-side select transistor write operation, the voltage VSRC is supplied to one or more bit lines BL (referred to as "bit line BLWD") connected to those drain-side select transistors STD whose threshold voltages are to be adjusted among the plurality of drain-side select transistors STD. A voltage VBLH is supplied to one or more bit lines BL (referred to as "bit line BLPD") connected to those drain-side select transistors STD whose threshold voltages are not being adjusted. The voltage VBLH is greater than the voltage VSRC. Those drain-side select transistors STD whose threshold voltages are to be adjusted are called "write select transistors STD", and those whose threshold voltages are not being adjusted are called "prohibited select transistors STD".

In the drain-side select transistor write operation, the voltage VSG is supplied to the drain-side select gate line SGDT. Therefore, an electron channel is formed in the channel region of the drain-side select transistor STDT, and the voltages VSRC and VBLH are transferred.

The program voltage VPGMS is also supplied to the drain-side select gate line SGD corresponding to the string unit SUa. The program voltage VPGMS is greater than the voltage VBLH and the write pass voltage VPASS.

A voltage VSRC is supplied to the channel of the semiconductor layer 120 corresponding to the bit line BLWD. A relatively large electric field is generated between such a semiconductor layer 120 and the drain-side select gate line SGD. As a result, electrons in the channel of the semiconductor layer 120 tunnel into the charge storage film 132 (FIG. 4) through the tunnel insulating film 131 (FIG. 4). Therefore, the threshold voltage of the write select transistor STD increases.

The voltage VBLH is supplied to the channel of the semiconductor layer 120 corresponding to the bit line BLPD. Between such a semiconductor layer 120 and the drain-side select gate line SGD, an electric field less than the electric field described above is generated. As a result, electrons in the channel of the semiconductor layer 120 do not tunnel into the charge storage film 132 (FIG. 4). Therefore, the threshold voltage of the prohibited select transistor STD does not increase.

In the drain-side select transistor write operation, the drain-side select gate lines SGD corresponding to the string units SUb to SUe are supplied with the ground voltage VSS. The voltage difference between the ground voltage VSS and the voltages VSRC and VBLH is less than the threshold voltage of the drain-side select transistor STD. Therefore, electron channels are not formed in the channel regions of the drain-side select transistors STD corresponding to the string units SUb to SUe, and the voltages VSRC and VBLH are not transferred.

In the drain-side select transistor write operation, the voltage VSRC is supplied to the source line SL, and the ground voltage VSS is supplied to the source-side select gate lines SGS and SGSB. As a result, the source-side select transistors STS and STSB are turned off.

Also, a voltage VPASSDD is supplied to the dummy word line DWL. The voltage VPASSDD is, for example, less than the program voltage VPGMS supplied to the drain-side select gate line SGD but greater than the write pass voltage VPASS supplied to the word lines WL. This reduces a sharp change in potential that would otherwise occur in the region between the drain-side select gate line SGD and the memory cell MC closest thereto. The voltage VPASSDD is greater than the voltage VSRC. Also, the voltage difference between the voltage VPASSDD and the voltage VSRC is greater than the threshold voltage of the dummy memory cell DMC. Therefore, an electron channel is formed in the channel region of the dummy memory cell DMC corresponding to the string unit SUa, and the voltages VSRC and VBLH are transferred.

Also, the write pass voltage VPASS is supplied to the word lines WL. Therefore, an electron channel is formed in the channel region of the memory cells MC corresponding to the string unit SUa, and the voltages VSRC and VBLH are transferred.

Comparative Example

Figure 9:
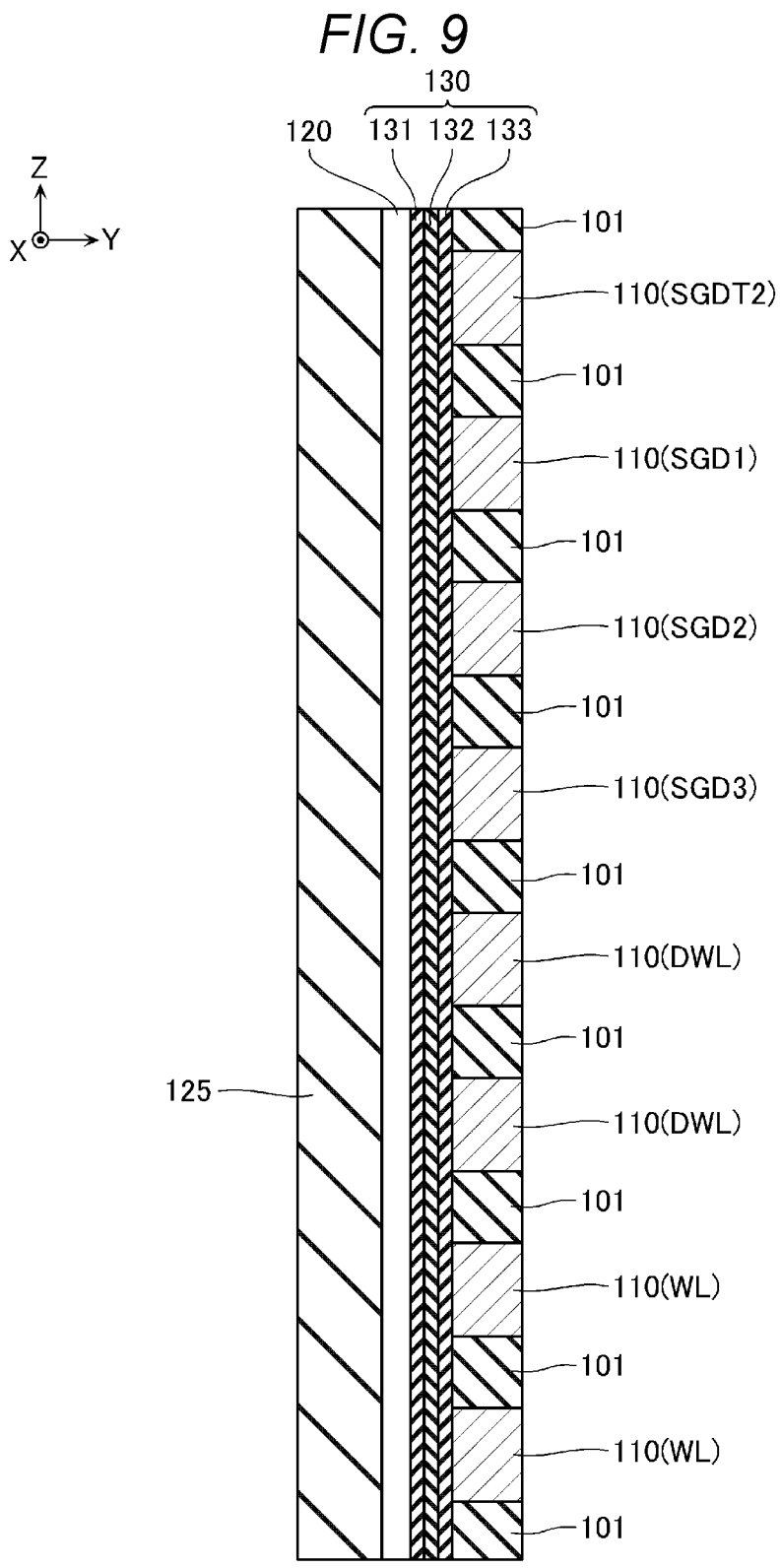
FIG. 9 is a schematic cross-sectional view showing a partial configuration of a semiconductor storage device according to a comparative example.

FIG. 9 is a schematic cross-sectional view showing a partial configuration of a semiconductor storage device according to a comparative example. In the semiconductor storage device according to the comparative example, all conductive layers 110 have approximately the same thickness in the Z direction. In addition, in the semiconductor storage device according to the comparative example, the region of the semiconductor layer 120 facing the conductive layer 110(SGD) contains P-type impurities such as boron (B).

In the manufacturing process of the semiconductor storage device according to the comparative example, when the P-type impurity is implanted into the semiconductor layer 120, control is performed such that the peak position of the concentration of the P-type impurity is in the vicinity of the conductive layer 110(SGD2). As a result, the cutoff position of the drain-side select transistor STD is controlled to be near the conductive layer 110(SGD2).
Fluctuation of Threshold Voltage of Drain-Side Select Transistor STD In the semiconductor storage device according to the comparative example, when write operations and erase operations are executed a plurality of times after executing a drain-side select transistor write operation, the threshold voltage of the drain-side select transistor STD may fluctuate. This may cause variations in the threshold voltage of the drain-side select transistor STD. The following reasons are conceivable as causes of such variations.

In the semiconductor storage device according to the comparative example, the upper end position of the semiconductor layer 120 may vary during the manufacturing process. In the semiconductor storage device according to the comparative example, the region of the semiconductor layer 120 facing the conductive layer 110(SGD) contains P-type impurities such as boron (B). This impurity is typically implanted from above after the semiconductor layer 120 has already formed. Therefore, if the upper end position of the semiconductor layer 120 varies, the peak position of the impurity concentration will also vary somewhat. For example, if the upper end position of some of the semiconductor layers 120 is lower than the upper end position of the other semiconductor layers 120, the P-type impurity will be implanted in a relatively deep position. As a result, in such semiconductor layers 120, the peak position of the impurity concentration may be nearer the conductive layer 110 (SGD3) instead of the conductive layer 110(SGD2).

Figure 10:
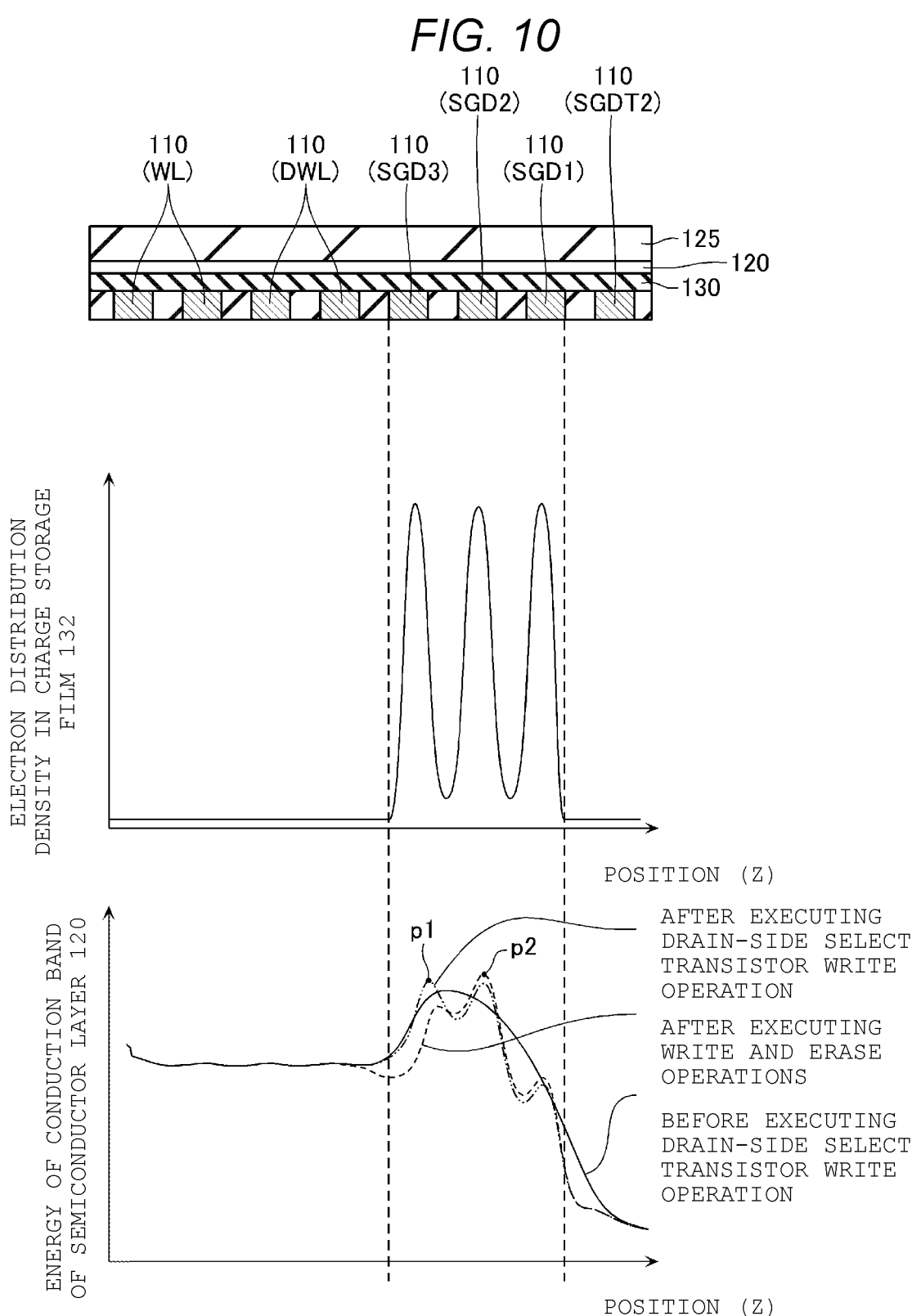
FIG. 10 is a diagram related to simulation results for a semiconductor storage device according to a comparative example.

FIG. 10 is a diagram depicting simulation results for the semiconductor storage device according to the comparative example. FIG. 10 shows two graphs. The first graph shows the electron distribution density in the charge storage film 132 in the range from the height position of the second conductive layer 110(WL) counted from above to the height position of the conductive layer 110(SGDT2). This graph shows characteristics immediately after executing a drain-side select transistor write operation. The second graph shows the energy of the conduction band of the semiconductor layer 120 in the range from the height position of the second conductive layer 110(WL) counted from above to the height position of the conductive layer 110(SGDT2). The second graph shows the characteristics immediately before executing a drain-side select transistor write operation, the characteristics immediately after executing a drain-side select transistor write operation, and the characteristics after write operations and erase operations have been executed a plurality of times after the drain-side select transistor write operation.

As indicated by the solid line in the second graph of FIG. 10, the energy of the conduction band in the semiconductor layer 120 may be maximized in the vicinity of the conductive layer 110(SGD3) immediately before executing the drain-side select transistor write operation. This is because, as described above, the peak position of the concentration of P-type impurities such as boron (B) may be located relatively near the conductive layer 110(SGD3).

As shown in the first graph of FIG. 10, immediately after executing the drain-side select transistor write operation, electrons are accumulated in the charge storage film 132 at height positions corresponding to the drain-side select gate lines SGD1 to SGD3. As a result, electron distribution density peaks occur at three height positions corresponding to the drain-side select gate lines SGD1 to SGD3. The electron distribution densities at these three peaks are approximately the same.

As indicated by the two-dot chain line in the second graph of FIG. 10, the energy of the conduction band in the semiconductor layer 120 fluctuates depending on the charge in the charge storage film 132 immediately after executing the drain-side select transistor write operation. That is, the energy of the conduction band is increased at the height positions corresponding to the drain-side select gate lines SGD1 to SGD3 in the semiconductor layer 120. As a result, the energy of the conduction band is maximized at the height position corresponding to the drain-side select gate line SGD3 (the height position indicated by point p1 in the drawing). In such a state, the height position indicated by point p1 in the drawing becomes the cutoff position of the drain-side select transistor STD.

As indicated by the dotted line in the second graph of FIG. 10, when the write operation and erase operation are executed a plurality of times after executing the drain-side select transistor write operation, the energy of the conduction band in the semiconductor layer 120 may fluctuate at the height position corresponding to the drain-side select gate line SGD3. This is because the potential difference between the conductive layer 110(SGD3) and the conductive layer 110(WL) is relatively large in the write operation and the erase operation, and hot carriers are generated in the semiconductor layer 120 in the vicinity of this region, and the hot carriers are accumulated in the charge storage film 132. As a result, the threshold voltage of the drain-side select transistor STD3 fluctuates, and the threshold voltage of the drain-side select transistor STD may vary.

In such a case, as shown in the drawing, the position where the energy of the conduction band in the semiconductor layer 120 is maximized tends to change from the height position corresponding to the drain-side select gate line SGD3 (the height position indicated by point p1 in the drawing) to the height position corresponding to the drain-side select gate line SGD2 (the height position indicated by point p2 in the drawing).

Effects of Semiconductor Storage Device According to First Embodiment

In the semiconductor storage device according to the first embodiment, in order to prevent fluctuations in the threshold voltage of the drain-side select transistor STD, the Z-direction lengths LZSGD1 and LZSGD2 of the conductive layers 110(SGD1) and 110(SGD2) are made greater than the Z-direction length LZSGD3 of the conductive layer 110(SGD3).

Figure 11:
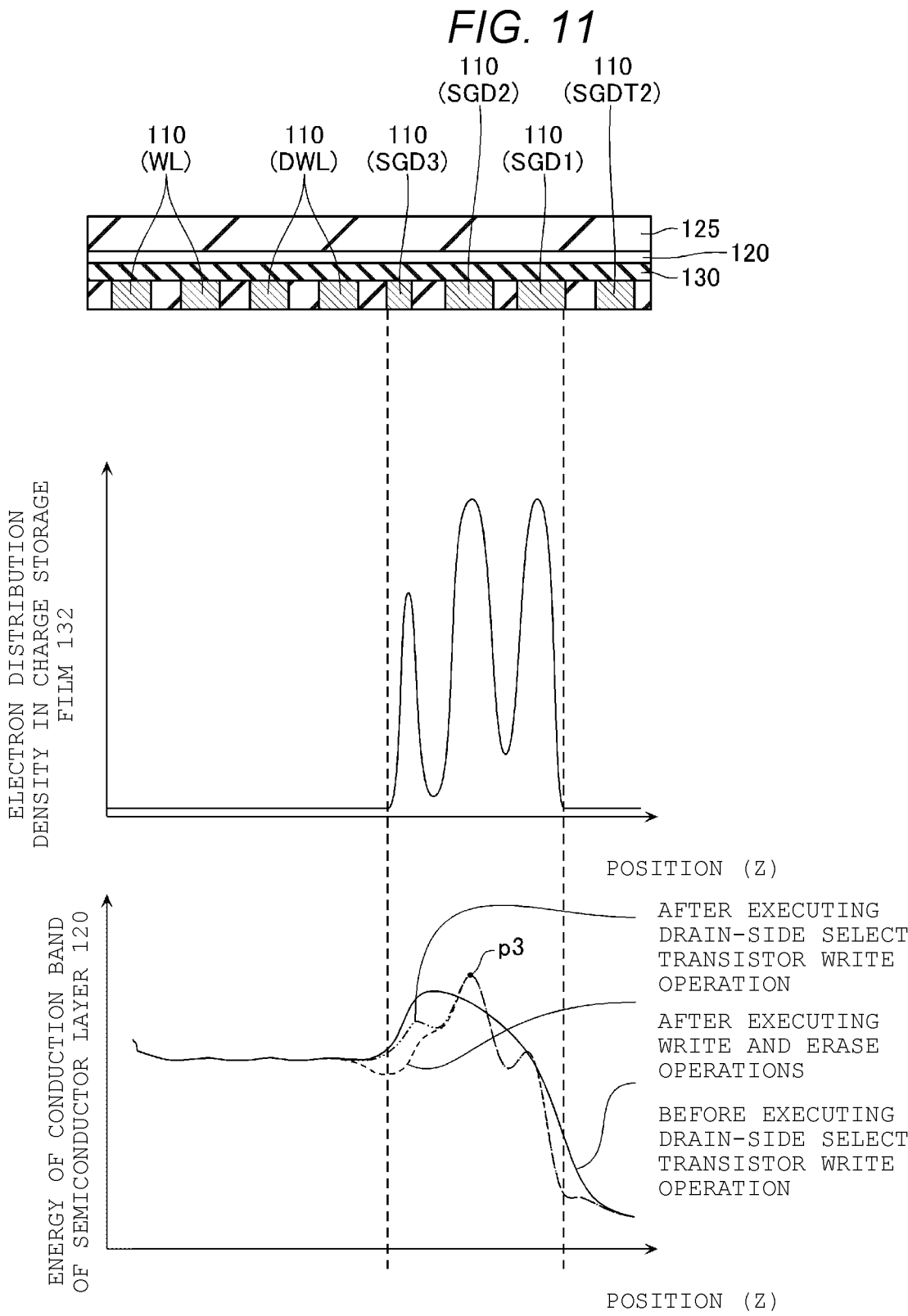
FIG. 11 is a diagram related to simulation results for a semiconductor storage device according to a first embodiment.

FIG. 11 is a diagram showing simulation results regarding the semiconductor storage device according to the first embodiment. FIG. 11 shows two graphs. The first graph shows the electron distribution density in the charge storage film 132 in the range from the height position of the second conductive layer 110(WL) counted from above to the height position of the conductive layer 110(SGDT2). This graph shows the characteristics immediately after executing a drain-side select transistor write operation. The second graph shows the energy of the conduction band of the semiconductor layer 120 in the range from the height position of the second conductive layer 110(WL) counted from above to the height position of the conductive layer 110(SGDT2). The second graph shows the characteristics immediately before executing a drain-side select transistor write operation, the characteristics immediately after executing a drain-side select transistor write operation, the characteristics after write operations and erase operations are executed a plurality of times after the drain-side select transistor write operation.

In the first embodiment, the region of the semiconductor layer 120 facing the conductive layer 110(SGD) may be undoped or may contain P-type impurities such as boron (B). The second graph in FIG. 11 shows an example in which the region of the semiconductor layer 120 facing the conductive layer 110(SGD) contains P-type impurities.

As indicated by the solid line in the second graph of FIG. 11, the energy of the conduction band in the semiconductor layer 120 may be maximized in the vicinity of the conductive layer 110(SGD3) immediately before executing the drain-side select transistor write operation.

As shown in the first graph of FIG. 11, immediately after executing the drain-side select transistor write operation, electrons are accumulated in the charge storage film 132 at height positions corresponding to the drain-side select gate lines SGD1 to SGD3. As a result, electron distribution density peaks occur at three height positions corresponding to the drain-side select gate lines SGD1 to SGD3.

For the semiconductor storage device according to the first embodiment, the Z-direction lengths LZSGD1 and LZSGD2 of the conductive layers 110(SGD1) and 110 (SGD2) are greater than the Z-direction length LZSGD3 of the conductive layer 110(SGD3). As a result, the amount of electrons accumulated in the charge storage film 132 at the height positions corresponding to the drain-side select gate lines SGD1 and SGD2 are greater than the amount of electrons accumulated in the charge storage film 132 at the height position corresponding to the drain-side select gate line SGD3. As a result, as shown in FIG. 11, the electron distribution densities at the peaks corresponding to the drain-side select gate lines SGD1 and SGD2 are higher than the electron distribution density at the peak corresponding to the drain-side select gate line SGD3.

In addition, as indicated by the two-dot chain line in the second graph of FIG. 11, immediately after executing the drain-side select transistor write operation, the energy of the conduction band in the semiconductor layer 120 fluctuates depending on the charges in the charge storage film 132. As a result, the energy of the conduction band is maximized at the height position corresponding to the drain-side select gate line SGD2 (the height position indicated by point p3 in the drawing). In such a state, the height position indicated by point p3 in the drawing becomes the cutoff position of the drain-side select transistor STD.

As indicated by the dotted line in the second graph of FIG. 11, when write operations and erase operations are executed a plurality of times after executing the drain-side select transistor write operation, the energy of the conduction band in the semiconductor layer 120 may fluctuate at the height position corresponding to the drain-side select gate line SGD3. However, in the semiconductor storage device according to the first embodiment, the cutoff position of the drain-side select transistor STD is the height position corresponding to the drain-side select gate line SGD2. Therefore, even if the energy of the conduction band in the semiconductor layer 120 fluctuates at the height position corresponding to the drain-side select gate line SGD3, the energy of the conduction band in the semiconductor layer 120 at the cut-off position of the drain-side select transistor STD does not substantially fluctuate. As a result, fluctuations in the threshold voltage of the drain-side select transistor STD can be reduced, and variations in the threshold voltage of the drain-side select transistor STD can be reduced.

In the semiconductor storage device according to the first embodiment, the Z-direction lengths LZSGD1 and LZSGD2 of the conductive layers 110(SGD1) and 110(SGD2) are greater than the Z-direction lengths LZSGD3 of the conductive layer 110(SGD3), thereby the peak position of the electron distribution density in the charge storage film 132 after executing the drain-side select transistor write operation is controlled to match or correspond to the height positions corresponding to the drain-side select gate lines SGD1 and SGD2. This makes it possible to control the cutoff position of the drain-side select transistor STD to this height position. Therefore, according to such a method, it is possible to omit the implantation of the P-type impurity into the semiconductor layer 120. In such a case, it is possible to provide the semiconductor storage device at a lower cost by reducing manufacturing steps.

Z-Direction Length of Conductive Layer 110(SGD)

Simulations were performed to examine aspects related to the thicknesses of the conductive layers 110(SGD) in the Z direction and the distances between the conductive layers 110(SGD) in the Z direction.

In the simulation, the Z-direction thicknesses of the conductive layers 110(SGD1), 110(SGD2), and 110(SGD3), the distance between the conductive layers 110(SGD1) and 110(SGD2), and the distance between the conductive layers 110(SGD2) and 110(SGD3) were varied in a plurality of ways and under different conditions, and how much the threshold voltage of the drain-side select transistor STD fluctuated was examined.

As a result of the simulation, it was observed that when the Z-direction length LZSGD3 of the conductive layer 110(SGD3) is small, the fluctuation amount of the threshold voltage of the drain-side select transistor STD tends to be relatively small. On the other hand, within the parameter range of the simulation, no clear correlation was observed among the Z-direction lengths of the conductive layers 110(SGD2) and 110(SGD3), the distance between the conductive layers 110(SGD1) and 110(SGD2), the distance between the conductive layers 110(SGD2) and 110(SGD3), and the fluctuation amount of the threshold voltage of the drain-side select transistor STD.

Based on these simulation results, the ratio of the Z-direction length LZSGD3 of the conductive layer 110(SGD3) and the Z-direction lengths LZSGD1 and LZSGD2 of the conductive layers 110(SGD1) and 110(SGD2) was calculated, and the relationship between this ratio and the fluctuation amount of the threshold voltage of the drain-side select transistor STD was examined.

Figure 12:
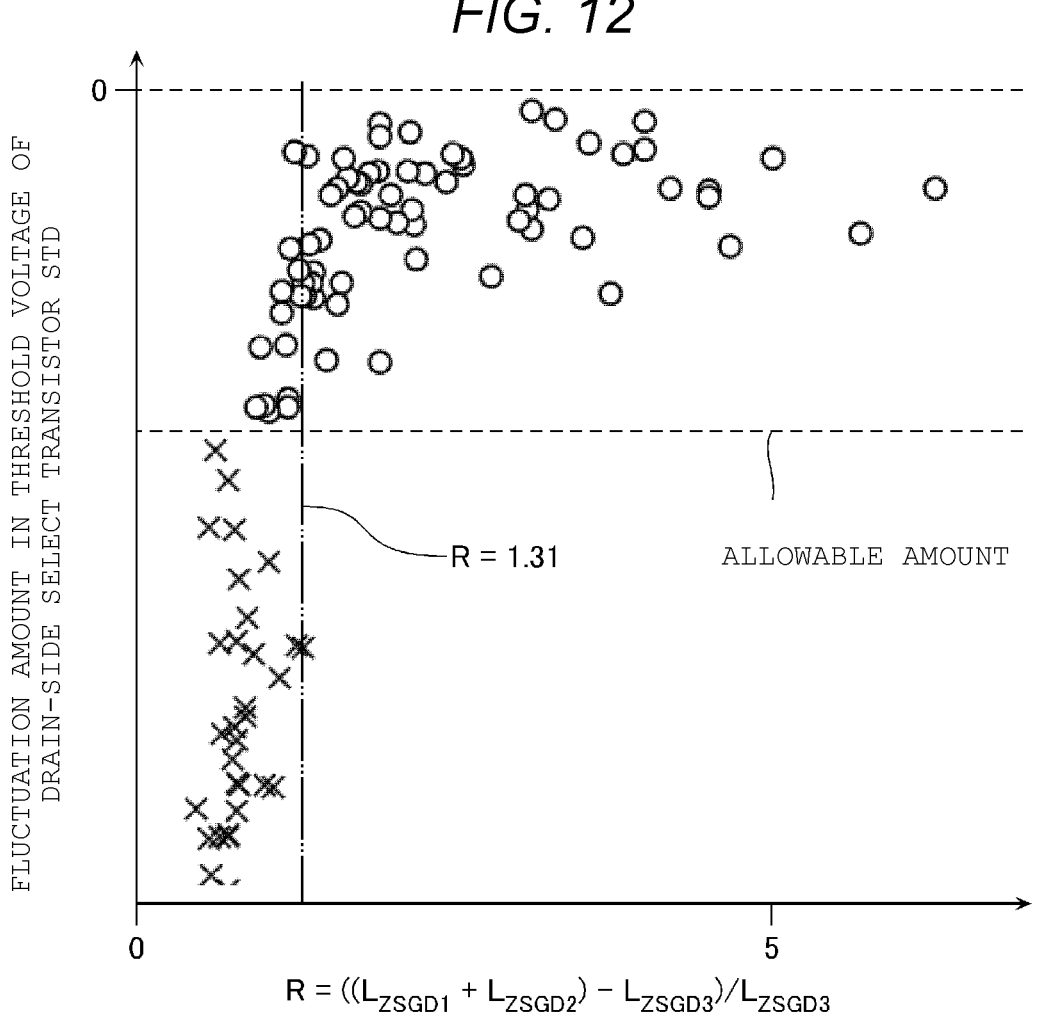
FIG. 12 is a graph depicting simulation results.

FIG. 12 is a graph showing related simulation results. The horizontal axis of FIG. 12 represents the variable R corresponding to the value of ((length LZSGD1+length LZSGD2)–length LZSGD3)/length LZSGD3. The vertical axis of FIG. 12 represents the fluctuation amount in the threshold voltage of the drain-side select transistor STD. In FIG. 12, the lower the point on the vertical axis, the larger the fluctuation in the threshold voltage.

According to the simulation results, as shown in FIG. 12, it was observed that the smaller the variable R, the more the fluctuation in the threshold voltage exceeded an allowable amount (level). Further, it was observed that the larger the variable R, the more likely the fluctuation in the threshold voltage fell within the range from zero (0) to the allowable amount. More specifically, the value of the variable R was 1.31 when the fluctuation in the threshold voltage before the allowable level was met. That is, when the variable R was greater than 1.31, the fluctuation in the threshold voltage fell within the range from 0 to the allowable level. Therefore, when the variable R is greater than 1.31 the fluctuation in the threshold voltage enters the allowable range.

Second Embodiment

In the semiconductor storage device according to the first embodiment, as described with reference to FIG. 4, both the Z-direction lengths of LZSGD1 and LZSGD2 of the conductive layers 110(SGD1) and 110(SGD2) are greater than the Z-direction length LZSGD3 of the conductive layer 110(SGD3). However, such a configuration is merely one possible example, and the specific configuration can be adjusted as appropriate. One of the Z-direction lengths LZSGD1 and LZSGD2 of the conductive layers 110(SGD1) and 110(SGD2) may be approximately the same as the Z-direction length LZSGD3 of the conductive layer 110 (SGD3) or may be smaller than the length LZSGD3. However, even in such a case, the Z-direction lengths LZSGD1, LZSGD2, and LZSGD3 of the conductive layers 110 (SGD1), 110(SGD2), and 110(SGD3) are desirably adjusted so that the variable R described above with reference to FIG. 12 is greater than 1.31.

Figure 13:
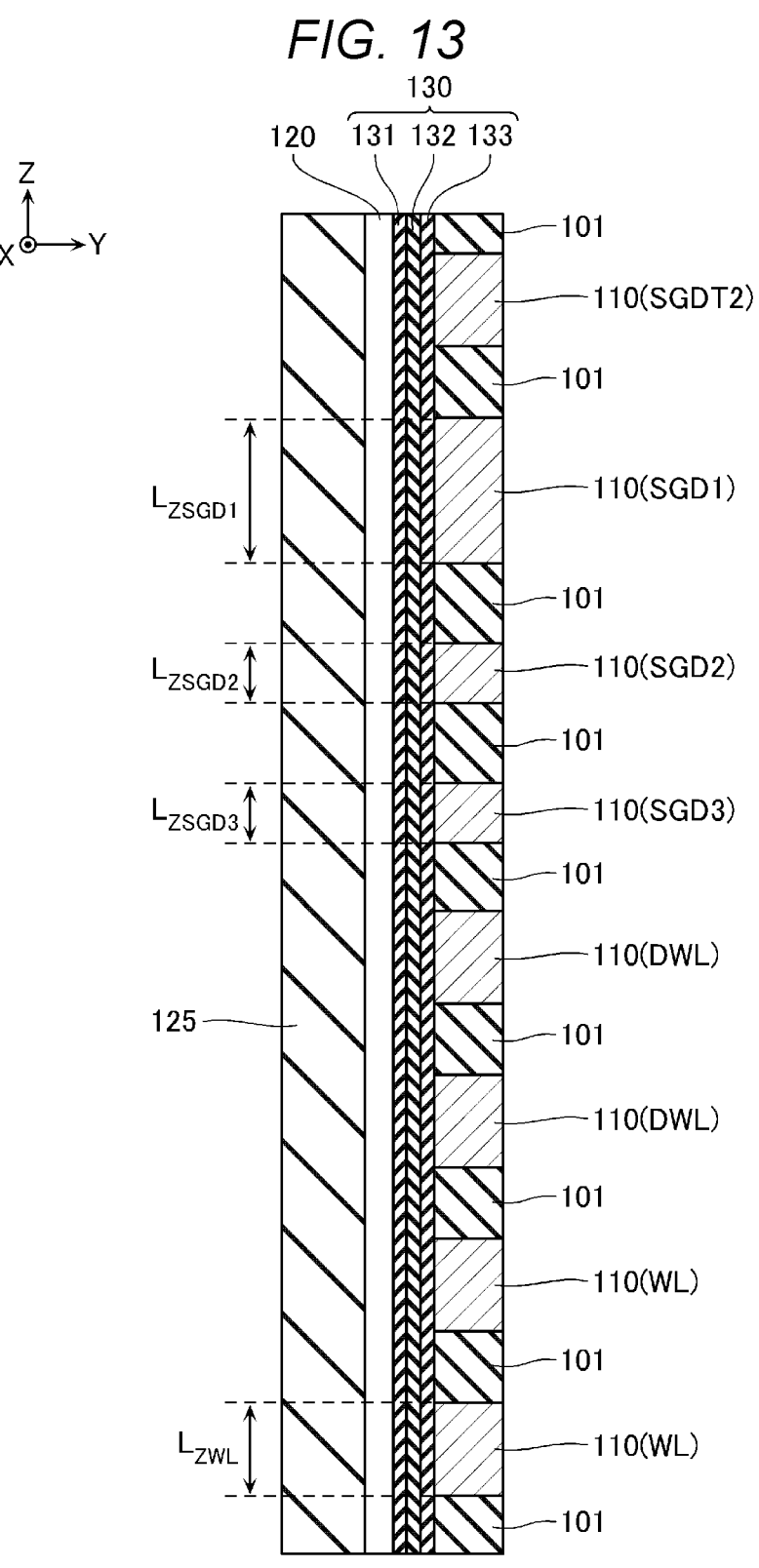
FIG. 13 is a schematic cross-sectional view showing a partial configuration of a semiconductor storage device according to a second embodiment.

FIG. 13 is a schematic cross-sectional view showing a partial configuration of a semiconductor storage device according to the second embodiment. Although FIG. 13 shows the YZ cross section, a structure similar to that of FIG. 13 is observed when a cross section other than the YZ cross section (for example, the XZ cross section) along the central axis of the semiconductor layer 120 is observed.

The semiconductor storage device according to the second embodiment is basically configured in the same manner as the semiconductor storage device according to the first embodiment. However, in the second embodiment, the Z-direction width LZSGD2 of the conductive layer 110(SGD2) substantially matches the Z-direction width LZSGD3 of the conductive layer 110(SGD3).

Third Embodiment

In the semiconductor storage device according to the first embodiment, as described with reference to FIG. 4, the Z-direction lengths LZSGD1 and LZSGD2 of the conductive layers 110(SGD1) and 110(SGD2) are greater than the Z-direction length LZWL of the conductive layer 110(WL). In the semiconductor storage device according to the second embodiment, as described with reference to FIG. 13, the Z-direction length LZSGD1 of the conductive layer 110 (SGD1) is greater than the Z-direction length LZWL of the conductive layer 110(WL). However, such configurations are non-limiting, and the specific configuration can be adjusted as appropriate. For example, at least one of the Z-direction lengths LZSGD1 and LZSGD2 of the conductive layers 110(SGD1) and 110(SGD2) may be approximately the same as the Z-direction length LZWL of the conductive layer 110(WL) and may be smaller than the Z-direction length LZWL. It is noted that, even in such a case, the Z-direction lengths LZSGD1, LZSGD2, and LZSGD3 of the conductive layers 110(SGD1), 110(SGD2), and 110(SGD3) are desirably adjusted so that the variable R is greater than 1.31.

Figure 14:
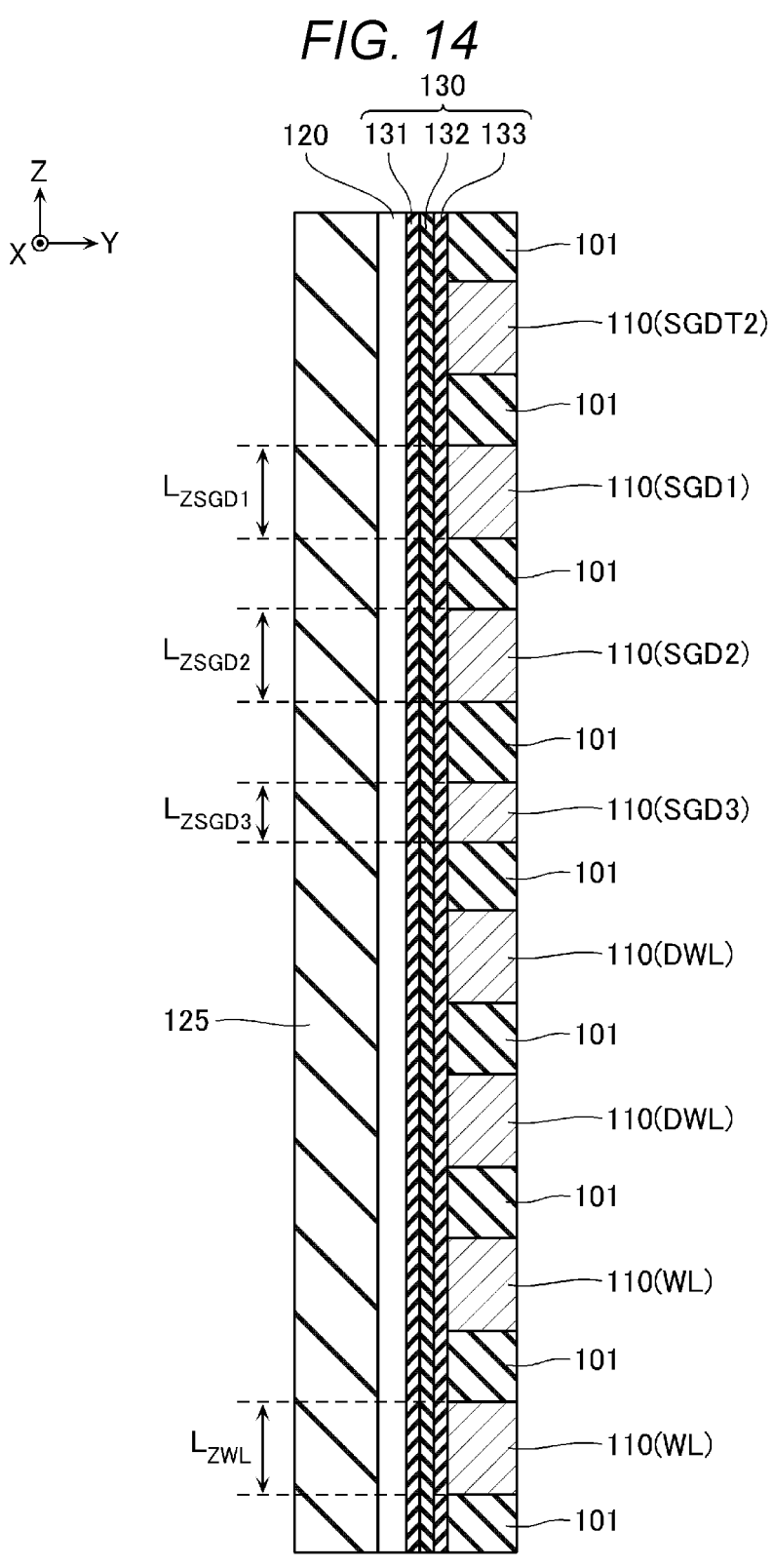
FIG. 14 is a schematic cross-sectional view showing a partial configuration of a semiconductor storage device according to a third embodiment.

FIG. 14 is a schematic cross-sectional view showing a partial configuration of a semiconductor storage device according to the third embodiment. Although FIG. 14 shows the YZ cross section, a structure similar to that of FIG. 14 is observed when a cross section other than the YZ cross section (for example, the XZ cross section) along the central axis of the semiconductor layer 120 is observed.

The semiconductor storage device according to the third embodiment is basically configured in the same manner as the semiconductor storage device according to the first embodiment. However, in the third embodiment, the Z-direction widths LZSGD1 and LZSGD2 of the conductive layers 110(SGD1) and 110(SGD2) substantially match the Z-direction width LZWL of the conductive layer 110(WL).

Fourth Embodiment

In the semiconductor storage devices according to the first to third embodiments, the Z-direction length LZSGD3 of the conductive layer 110(SGD3) is less than the Z-direction length LZWL of the conductive layer 110(WL). However, such a configuration is merely an example, and the specific configuration may be adjusted as appropriate. For example, the Z-direction length LZSGD3 of the conductive layer 110(SGD3) may be approximately the same as the Z-direction length LZWL of the conductive layer 110(WL) or may be greater than the length LZWL. It is noted that, even in such a case, the Z-direction lengths LZSGD1, LZSGD2, and LZSGD3 of the conductive layers 110(SGD1), 110(SGD2), and 110(SGD3) are desirably adjusted so that the variable R is greater than 1.31.

Figure 15:
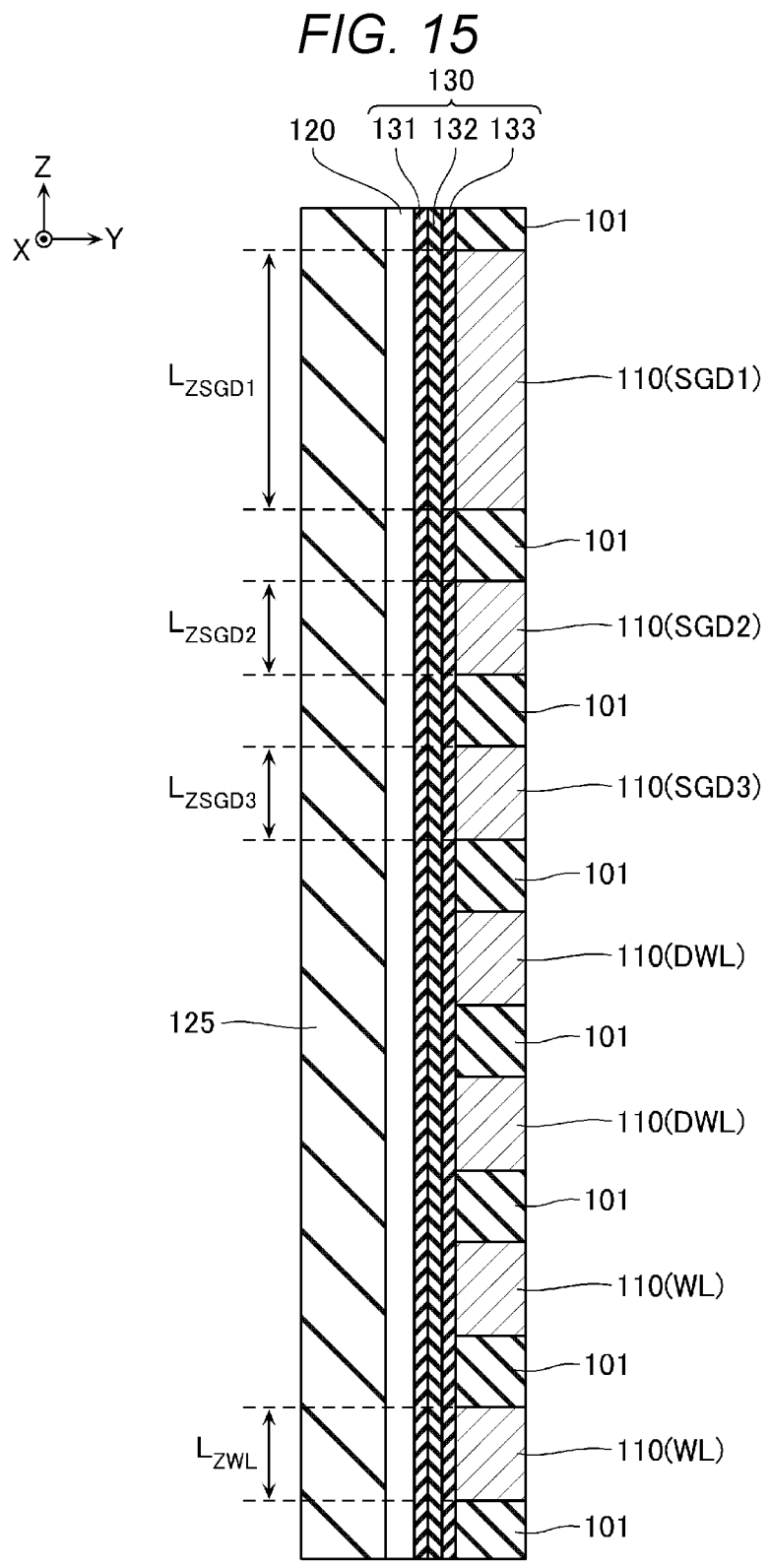
FIG. 15 is a schematic cross-sectional view showing a partial configuration of a semiconductor storage device according to a fourth embodiment.

FIG. 15 is a schematic cross-sectional view showing a partial configuration of the semiconductor storage device according to the fourth embodiment. Although FIG. 15 shows the YZ cross section, a structure similar to that of FIG. 15 is also observed when a cross section other than the YZ cross section (for example, the XZ cross section) along the central axis of the semiconductor layer 120 is observed.

The semiconductor storage device according to the fourth embodiment is basically configured in the same manner as the semiconductor storage device according to the second embodiment. However, in the fourth embodiment, the Z-direction widths LZSGD2 and LZSGD3 of the conductive layers 110(SGD2) and 110(SGD3) substantially match the Z-direction width LZWL of the conductive layer 110(WL).

Other Embodiments

In the semiconductor storage devices according to the first to fourth embodiments, three (conductive layers 110

(SGD1), 110(SGD2), and 110(SGD3)) among the plurality of conductive layers 110 located in the Z direction function as the gate electrodes of the drain-side select transistors STD. However, the number of conductive layers 110(SGD) functioning as gate electrodes of the drain-side select transistors STD may be two, or four or more in other examples.

When there are three conductive layers 110(SGD), as described with reference to FIG. 12, it is desirable to set the Z-direction lengths LZSGD1, LZSGD2, and LZSGD3 of the conductive layers 110(SGD1), 110(SGD2), and 110(SGD3) so that the variable R represented by ((length LZSGD1+length LZSGD2)−length LZSGD3)/length LZSGD3 becomes greater than 1.31.

When there are N conductive layers 110(SGD) (where N is an integer equal to or greater than 2), and the sum of the Z-direction lengths of the N conductive layers 110(SGD) (total layer thickness) is set to LSUM, and the Z-direction length (layer thickness) of the lowermost one of the N conductive layers 110(SGD) is set to LZ, it is desirable to adjust the Z-direction length (layer thickness) of the conductive layer 110(SGD) so that the value represented by (LSUM−LZ×(N−1))/LZ becomes greater than 1.31.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a plurality of word lines spaced from each other in a first direction;
a plurality of bit lines on one side of the plurality of word lines in the first direction;
a first plurality of select gate lines between the plurality of word lines and the plurality of bit lines in the first direction, the first plurality of select gate lines being spaced from each other in the first direction;
a second plurality of select gate lines between the plurality of word lines and the plurality of bit lines in the first direction, the second plurality of select gate lines being spaced from each other in the first direction, and adjacent the first plurality of select gate lines in a second direction intersecting the first direction;
a first semiconductor layer extending in the first direction through the plurality of word lines and the first plurality of select gate lines and electrically connected to one of the plurality of bit lines;
a second semiconductor layer extending in the first direction through the plurality of word lines and the second plurality of select gate lines and electrically connected to one of the plurality of bit lines; and
a charge storage film between the plurality of word lines and the first semiconductor layer, wherein
the first plurality of select gate lines includes:
a first select gate line closest to the plurality of word lines in the first direction and having a first thickness in the first direction, and
a second select gate line between the first select gate line and the plurality of bit lines in the first direction and having a second thickness in the first direction,
the first thickness is less than the second thickness, and the second plurality of select gate lines includes:
a third select gate line between the plurality of word lines and the plurality of bit lines in the first direction, and
a fourth select gate line between the third select gate line and the plurality of bit lines in the first direction.

2. The semiconductor storage device according to claim 1, wherein the first plurality of select gate lines are electrically connected to each other.

3. The semiconductor storage device according to claim 1, wherein
a sum of thicknesses of the first plurality of select gate lines in the first direction is $L_{SUM}$,
the first thickness is $L_Z$,
the number of select gate lines in the first plurality of select gate lines is N, and
the value represented by $(L_{SUM}-L_Z\times(N-1))/L_Z$ is greater than 1.31.

4. The semiconductor storage device according to claim 1, wherein
the first semiconductor layer includes a first region facing the first plurality of select gate lines, and
the first region does not contain P-type impurities.

5. The semiconductor storage device according to claim 1, wherein
the first semiconductor layer includes a first region facing the first plurality of select gate lines, and
the first region contains P-type impurities.

6. The semiconductor storage device according to claim 1, wherein the first plurality of select gate lines is electrically separated from the second plurality of select gate lines.

7. The semiconductor storage device according to claim 1, wherein
the first plurality of select gate lines further includes:
a fifth select gate line between the first select gate line and the plurality of bit lines in the first direction with a third thickness in the first direction, and
the third thickness substantially matches the first thickness or the second thickness.

8. The semiconductor storage device according to claim 1, wherein a thickness of each of the plurality of word lines in the first direction is substantially equal to the first thickness or the second thickness.

9. The semiconductor storage device according to claim 1, further comprising:
a fifth select gate line between the first plurality of select gate lines and the plurality of bit lines in the first direction, wherein
a portion of the first semiconductor layer faces the fifth select gate line, and
the fifth select gate line is configured to be supplied with a voltage that is different from a voltage supplied to the first plurality of select gate lines.

10. The semiconductor storage device according to claim 9, wherein the portion of the first semiconductor layer facing the third select gate line contains N-type impurities.

11. The semiconductor storage device according to claim 1, wherein the charge storage film is also between the first plurality of select gate lines and the first semiconductor layer.

12. A semiconductor storage device, comprising:
a plurality of first conductive layers spaced from one another in a first direction;
a plurality of second conductive layers on one side of the plurality of first conductive layers in the first direction, the plurality of second conductive layers spaced from one another in the first direction and electrically connected to each other;

a first semiconductor column extending in the first direction through the plurality of first conductive layers and the plurality of second conductive layers;

a plurality of third conductive layers adjacent to the plurality of second conductive layers in a second direction intersecting the first direction;

a second semiconductor column extending in the first direction through the plurality of first conductive layers and the plurality of third conductive layers; and a charge storage film between the plurality of first conductive layers and the first semiconductor column, wherein the plurality of second conductive layers includes:

a first-thickness conductive layer closest to the plurality of first conductive layers, and a second-thickness conductive layer, and a thickness of the first-thickness conductive layer in the first direction is less than a thickness of the second-thickness conductive layer in the first direction.

13. The semiconductor storage device according to claim 12, further comprising:

a plurality of bit lines, the plurality of second conductive layers being between the plurality of first conductive layers and the plurality of bit lines in the first direction, wherein one of the plurality of bit lines is electrically connected to the first semiconductor column.

14. The semiconductor storage device according to claim 12, wherein a total layer thickness of the plurality of second conductive layers is $L_{SUM}$, the thickness of the first-thickness conductive layer is $L_Z$, the number of second conductive layers in the plurality of second conductive layers is N, and the value represented by $(L_{SUM}-L_Z \times (N-1))/L_Z$ is greater than 1.31.

15. The semiconductor storage device according to claim 12, wherein the first semiconductor column includes a first region facing the plurality of second conductive layers, and the first region does not contain P-type impurities.

16. The semiconductor storage device according to claim 12, wherein the plurality of second conductive layers is electrically separated from the plurality of third conductive layers.

17. The semiconductor storage device according to claim 12, further comprising:

a fourth conductive layer on one side of the plurality of second conductive layers in the first direction, the plurality of second conductive layers being between the plurality of first conductive layers and the fourth conductive layer in the first direction, wherein the first semiconductor column faces the fourth conductive layer, and the fourth conductive layer is electrically separated from the plurality of second conductive layers.

18. The semiconductor storage device according to claim 12, wherein the charge storage film is also between the first semiconductor column and the plurality of second conductive layers.

19. A semiconductor storage device, comprising:

a plurality of word lines spaced from each other in a first direction;

a plurality of bit lines on one side of the plurality of word lines in the first direction;

a first plurality of select gate lines between the plurality of word lines and the plurality of bit lines in the first direction, the first plurality of select gate lines being spaced from each other in the first direction;

a first semiconductor layer extending in the first direction through the plurality of word lines and the first plurality of select gate lines and electrically connected to one of the plurality of bit lines;

a third select gate line between the first plurality of select gate lines and the plurality of bit lines in the first direction; and a charge storage film between the plurality of word lines and the first semiconductor layer, wherein the first plurality of select gate lines includes:

a first select gate line closest to the plurality of word lines in the first direction and having a first thickness in the first direction, and a second select gate line between the first select gate line and the plurality of bit lines in the first direction and having a second thickness in the first direction, a portion of the first semiconductor layer faces the third select gate line, the third select gate line is configured to be supplied with a voltage that is different from a voltage supplied to the first plurality of select gate lines, and the first thickness is less than the second thickness.

20. The semiconductor storage device according to claim 19, wherein a sum of thicknesses of the first plurality of select gate lines in the first direction is $L_{SUM}$, the first thickness is $L_Z$, the number of select gate lines in the first plurality of select gate lines is N, and the value represented by $(L_{SUM}-L_Z \times (N-1))/L_Z$ is greater than 1.31.

* * * * *